(12) United States Patent
Gleason et al.

(10) Patent No.: US 8,779,071 B2
(45) Date of Patent: *Jul. 15, 2014

(54) CONDUCTIVE POLYMER FILMS GRAFTED ON ORGANIC SUBSTRATES

(75) Inventors: Karen K. Gleason, Cambridge, MA (US); Sung G. Im, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 754 days.

This patent is subject to a terminal disclaimer.

(21) Appl. No.: 12/525,376

(22) PCT Filed: Jan. 31, 2008

(86) PCT No.: PCT/US2008/052638
§ 371 (c)(1),
(2), (4) Date: Oct. 23, 2009

(87) PCT Pub. No.: WO2008/118534
PCT Pub. Date: Oct. 2, 2008

(65) Prior Publication Data
US 2010/0048830 A1 Feb. 25, 2010

Related U.S. Application Data

(60) Provisional application No. 60/898,981, filed on Feb. 1, 2007.

(51) Int. Cl.
C08G 73/06 (2006.01)
B05D 3/12 (2006.01)
C08L 67/00 (2006.01)

(52) U.S. Cl.
USPC ............ 525/418; 525/275; 427/240

(58) Field of Classification Search
None
See application file for complete search history.

(56) References Cited

U.S. PATENT DOCUMENTS 5,134,177 A * 7/1992 Aklonis et al. ............... 523/201
5,407,699 A * 4/1995 Myers ........................... 427/121

(Continued)

OTHER PUBLICATIONS

Mohammadi ("Chemical Vapour Deposition (CVD) of Conducting Polymers: Polypyrrole", Synthetic Metals, vol. 14, 1986, p. 189).*

(Continued)

*Primary Examiner* — Randy Gulakowski
*Assistant Examiner* — Jeffrey Washville
(74) *Attorney, Agent, or Firm* — Alan W. Steele; Foley Hoag LLP

(57) ABSTRACT

One aspect of the invention relates to a linker-free, one-step method of grafting polymer films onto organic substrates, and the films obtained by such a method. In certain embodiments, the grafted polymer films are conductive. In certain embodiments, said grafting method utilizes the ability for Friedel-Crafts catalyst to form radical cations from organic substrates. In one embodiment, the method provides poly-3,4-ethylenedioxythiophene (PEDOT) thin films grafted to organic substrates. In other embodiments, the method is applicable to the polymerization of other monomers to yield conducting polymers, such as polyanilines, polypyrroles, polyfurans, polythiophenes and their derivatives. Remarkably, the polymer films grafted by the inventive methods show enormous increases in adhesion strength. Further, in certain embodiments, polymer patterns were easily obtained using the inventive methods and soft lithography techniques. In certain embodiments, well-defined high-density line-and-space patterns were successfully obtained. In certain embodiments, e.g., when the polymer film is conducting, the obtained conducting polymer pattern grafted on common organic substrates can be used for integrated circuitry in flexible electronics.

14 Claims, 13 Drawing Sheets

(56) References Cited

U.S. PATENT DOCUMENTS

| | | |
|---|---|---|
| 5,751,018 A | 5/1998 | Alivisatos et al. |
| 6,605,236 B1 | 8/2003 | Smith et al. |
| 2001/0050271 A1 | 12/2001 | Matsushima et al. |
| 2003/0219597 A1 | 11/2003 | Carr et al. |
| 2005/0061235 A1 | 3/2005 | Ha et al. |
| 2006/0269664 A1* | 11/2006 | Gleason et al. ............ 427/248.1 |
| 2007/0117271 A1 | 5/2007 | Kodas et al. |

OTHER PUBLICATIONS

International Search Report for PCT/US08/052638 mailed Sep. 10, 2008.

* cited by examiner

| name | abbreviation | structure |
|---|---|---|
| poly styrene | poly styrene |  |
| poly ethyleneterephthalate | PET |  |
| poly carbonate | PC |  |
| poly ethylenenaphthalate | PEN |  |
| poly urethane | PU |  |
| poly (acrylonitrile-butadiene-styrene) | ABS |  |

| name | abbreviation | structure |
|---|---|---|
| poly ethylene | PE |  |
| poly propylene | PP |  |
| poly tetrafluoroethylene | PTFE |  |
| poly ethyleneoxide | PEO |  |

[A]

[B]

CONDUCTIVE POLYMER FILMS GRAFTED ON ORGANIC SUBSTRATES

RELATED APPLICATIONS

This application is the United States National Stage of Patent Cooperation Treaty Application number PCT/US2008/052638, filed Jan. 31, 2008, which claims the benefit of priority to U.S. Provisional Patent Application Ser. No. 60/898,981, filed Feb. 1, 2007; the entirety of which is hereby incorporated by reference.

GOVERNMENT SUPPORT

This invention was made with government support under Grant No DAAD19-02-D-0002, awarded by the Army Research Office. The government has certain rights in the invention.

BACKGROUND OF THE INVENTION

Historically, integrated circuits have been flat and rigid, but the current development of "flexible electronics" envisions rollable displays and wearable electronics, and promises to revolutionize our daily lives. (S. R. Forrest, *Nature* 2004, 428, 911; A. L. Briseno, S. C. B. Mannsfeld, M. M. Ling, S. H. Liu, R. J. Tseng, C. Reese, M. E. Roberts, Y. Yang, F. Wudl, Z. N. Bao, *Nature* 2006, 444, 913; J. H. Ahn, H. S. Kim, K. J. Lee, S. Jeon, S. J. Kang, Y. G. Sun, R. G. Nuzzo, J. A. Rogers, *Science* 2006, 314, 1754; D. Y. Khang, H. Q. Jiang, Y. Huang, J. A. Rogers, *Science* 2006, 311, 208; and L. Groenendaal, G. Zotti, P. H. Aubert, S. M. Waybright, J. R. Reynolds, *Advanced Materials* 2003, 15, 855.) Thanks to the explosive improvement in the performance of devices made from organic materials in recent years, conjugated organic materials are regarded as one of the most promising candidates for commercializable flexible electronics. (A. L. Briseno, S. C. B. Mannsfeld, M. M. Ling, S. H. Liu, R. J. Tseng, C. Reese, M. E. Roberts, Y. Yang, F. Wudl, Z. N. Bao, *Nature* 2006, 444, 913; and Y. R. Sun, N. C. Giebink, H. Kanno, B. W. Ma, M. E. Thompson, S. R. Forrest, *Nature* 2006, 440, 908.) Current efforts are mainly focused on increasing the performance of devices and the density of integration of the devices for high-end electronic applications. (D. Y. Khang, H. Q. Jiang, Y. Huang, J. A. Rogers, *Science* 2006, 311, 208.)

Patterning is essential for the fabrication of the integrated circuitry. Special attention must be paid to conducting polymer processes because the organic layers must retain their own electronic properties after the patterning process. For this purpose, various modified methods for patterning of conducting polymer have been devised. (Holdcroft, S. *Advanced Materials* 2001, 13, 1753-1765.) For example, in the electrooxidative deposition of conjugated polymers (such as polypyrrole and polyaniline) on a surface, a pre-patterned metal layer was been used for electropolymerization and a pre-patterned oxidizing agent layer was applied to oxidative polymerization of conducting polymer. (Sayre, C. N. & Collard, D. M. *Langmuir* 1997, 13, 714-722; Collard, D. M. & Sayre, C. N. *Synthetic Metals* 1997, 84, 329-332; Sayre, C. N. & Collard, D. M. *Journal of Materials Chemistry* 1997, 7, 909-912; Li, Z. F. & Ruckenstein, E. *Macromolecules* 2002, 35, 9506-9512; and Ruckenstein, E. & Li, Z. F. Advances in Colloid and Interface *Science* 2005, 113, 43-63.) In addition, photo-sensitive precursor polymer films have been selectively developed by irradiation and then subsequently converted to patterned conducting polymer. (Renak, M. L., Bazan, G. C. & Roitman, D. Advanced Materials 1997, 9, 392-395. Further, physical patterning method of ink-jet printing, screen printing, and soft lithography technique have also been used for micron-size pattern of conducting polymer. Recently, the use of near-field optical lithography of a conjugated polymer was reported, whose resolution can reach 160 nm. (Sirringhaus, H. et al. *Science* 2000, 290, 2123-2126; Bao, Z. N., Feng, Y., Dodabalapur, A., Raju, V. R. & Lovinger, A. J. *Chemistry of Materials* 1997, 9, 1299; Rogers, J. A. et al. *Proceedings of the National Academy of Sciences of the United States of America* 2001, 98, 4835-4840; Richards, D. & Cacialli, F. *Philosophical Transactions of the Royal Society of London Series A-Mathematical Physical and Engineering Sciences* 2004, 362, 771-786; and Riehn, R., Charas, A., Morgado, J. & Cacialli, F. *Applied Physics Letters* 2003, 82, 526-528.)

However, although current lithographic techniques for inorganic semiconductor chips produce feature sizes as small as a few tens of nanometers, most if not all of these techniques are incompatible with organic materials. (J. A. DeFranco, B. S. Schmidt, M. Lipson, G. G. Malliaras, *Organic Electronics* 2006, 7, 22.) For example, organic substrates can be damaged by wet chemical treatments and are vulnerable to mechanical stress from the patterning process. These constraints demand either the modification of photolithography or newly devised schemes applicable to organic materials. (J. A. DeFranco, B. S. Schmidt, M. Lipson, G. G. Malliaras, *Organic Electronics* 2006, 7, 22; and C. D. Muller, A. Falcou, N. Reckefas, M. Rojahn, V. Wiederhim, P. Rudati, H. Frohne, O. Nuyken, H. Becker, K. Meerholz, *Nature* 2003, 421, 829.) However, the performance of these circumvented strategies is still far from that of current photolithographic techniques in terms of minimum feature size, reliability, and throughput of patterning. (S. Holdcroft, *Advanced Materials* 2001, 13, 1753.) The ability to produce dense patterns of sub-micron features over the entire area of the substrate is limited by insufficient adhesion which results in mechanical failures, such as cracks, displacements, and delaminations. (J. A. DeFranco, B. S. Schmidt, M. Lipson, G. G. Malliaras, *Organic Electronics* 2006, 7, 22.)

Moreover, for maximized durability and reliability of flexible electronic devices, mechanical robustness is extremely important, requiring excellent interfacial properties and adhesion between the conductive thin film and flexible polymeric substrates. (Y. Leterrier, L. Medico, F. Demarco, J. A. E. Manson, U. Betz, M. F. Escola, M. K. Olsson, F. Atamny, *Thin Solid Films* 2004, 460, 156.) Transparent conducting oxides (TCOs), such as indium tin oxide (ITO), which are usually used as anode materials in organic electronics, are inherently brittle, which limits their applications in flexible electronics. (Z. Chen, B. Cotterell, W. Wang, *Engineering Fracture Mechanics* 2002, 69, 597.) Conducting polymer films regarded as alternatives to TCOs are weakly physisorbed on substrates, and are also vulnerable to the delamination from the substrates with repeated flexing. (G. P. Crawford, *Flexible flat panel displays*, John Wiley & Sons, Hoboken, N.J., 2005.) Covalent bonding of conducting polymer films to substrates can prevent delamination.

In spite of its engineering significance, only a few reports address grafting of conducting polymers. For example, Ruckenstein and Li have reported a conducting polyaniline film grafted on glass plates using a silane coupling agent. (Li, Z. F. & Ruckenstein, E. *Synthetic Metals* 2002, 129, 73-83; Li, Z. F. & Ruckenstein, E. *Macromolecules* 2002, 35, 9506-9512; and Ruckenstein, E. & Li, Z. F. *Advances in Colloid and Interface Science* 2005, 113, 43-63.) A similar approach was also performed for grafted poly (3-hexylthiophene) (P3HT) on Si wafer. (Liu, C. J., Oshima, K., Shimomura, M. & Miyauchi, S. *Journal of Applied Polymer Science* 2006, 100, 1881-1888.) It has further been shown that grafted poly pyrrole can also be obtained on various metal and metal oxide surfaces using phosphonic acids. (Oberoi, S., Jahne, E. & Adler, H. J. P. *Macromolecular Symposia* 2004, 217, 147-159.) However, these methods require tedious stepwise reactions to attach linkers for further grafting of conducting polymer. Further, while precursor polymers have been used for grafting of conducting polymer using post-functionalization, the grafting was not confined to the surface. (Bhattacharya, A. & Misra, B. N. *Progress in Polymer Science* 2004, 29, 767-814.

SUMMARY OF THE INVENTION

Certain aspects of the invention relate to a linker-free, one-step method of grafting polymer films onto organic substrates, and the films obtained by such methods. In certain embodiments, the grafted polymer films are conductive. In certain embodiments, the grafting method utilizes the ability for Friedel-Crafts catalyst to form radical cations from organic substrates. In certain embodiments, the methods provide poly-3,4-ethylenedioxythiophene (PEDOT) thin films grafted to organic substrates. In other embodiments, the methods are applicable to the polymerization of other monomers to yield conducting polymers, such as polyanilines, polyfurans, polypyrroles, polythiophenes, and their derivatives.

Remarkably, the polymer films grafted by the inventive methods show enormous increases in adhesion strength. Further, in certain embodiments, polymer patterns were easily obtained using the inventive methods and soft lithography techniques. In certain embodiments, uniformly well-defined high-density line-and-space patterns were successfully obtained. In certain embodiments, e.g., when the polymer film is conducting, the obtained conducting polymer pattern grafted on common organic substrates can be used for integrated circuitry in flexible electronics.

DETAILED DESCRIPTION OF THE INVENTION

Certain aspects of the invention relate to a process for grafting conducting polymers onto flexible polymer substrates which contain aromatic groups using Friedel-Crafts catalysts. Remarkably, this process, termed oxidative chemical vapor deposition (oCVD), does not employ a linker, such as silane or thiol compounds, but relies on covalent bonding directly between the conducting polymer film and aromatic moiety in these polymeric substrates. In certain embodiments, the substrate should contain aromatic groups: no specific surface treatment is needed. As described herein, grafting conducting polymers onto flexible polymer substrates which contain aromatic groups using Friedel-Crafts catalysts can be done on various, widely-used flexible substrates, such as polystyrene (poly styrene), polyethyleneterephthalate (PET), and polycarbonate (PC) in as-received form, which therefore offers the possibility of mass-production of grafted flexible conducting layers at low cost. For example, the inherently grafted poly (3,4-ethylenedioxythiophene) (PEDOT) displays greatly enhanced adhesion, thus enabling patterning down to 60 nm features on flexible PET substrates. In addition, in certain embodiments, patterns could be defined by a variety of methods including conventional photolithography, non-conventional physical molding (capillary force lithography), and e-beam lithography. (K. Y. Suh, H. H. Lee, *Advanced Functional Materials* 2002, 12, 405.) Previously, oCVD films were demonstrated to provide conformal coverage and conductivities>700 S/cm were achieved. (S. G. Im, K. K. Gleason, *Macromolecules*, accepted for publication 2007; S. G. Im, E. A. Olivetti, K. K. Gleason, *Applied Physics Letters* 2007, 90, 152112; and J. P. Lock, S. G. Im, K. K. Gleason, *Macromolecules* 2006, 39, 5326.) Obtaining high resolution features of conformal conducting polymer films on transparent plastic substrates serves as a potential route for fabrication of high-end flexible electronic devices.

Figure 11:
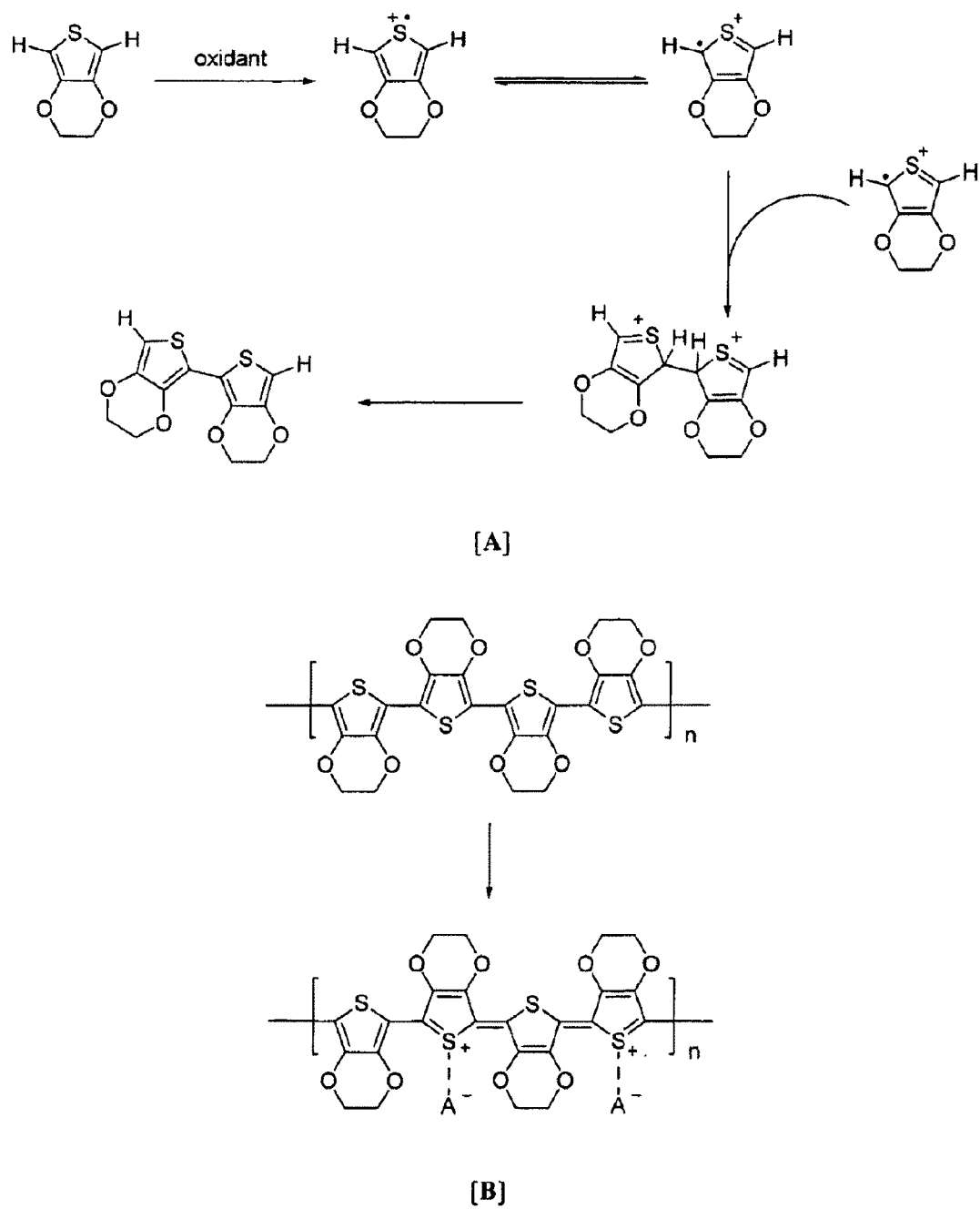
FIG. 11 depicts (A) the Diaz mechanism for oxidative polymerization; and (B) the oxidation of neutral poly-3,4-ethylenedioxythiophene (PEDOT) to form a conducting polycation that is charged balanced with dopant anions ($A^-$). In certain embodiments, these dopant anions are covalently linked to form a polyanion.
Figure 12:
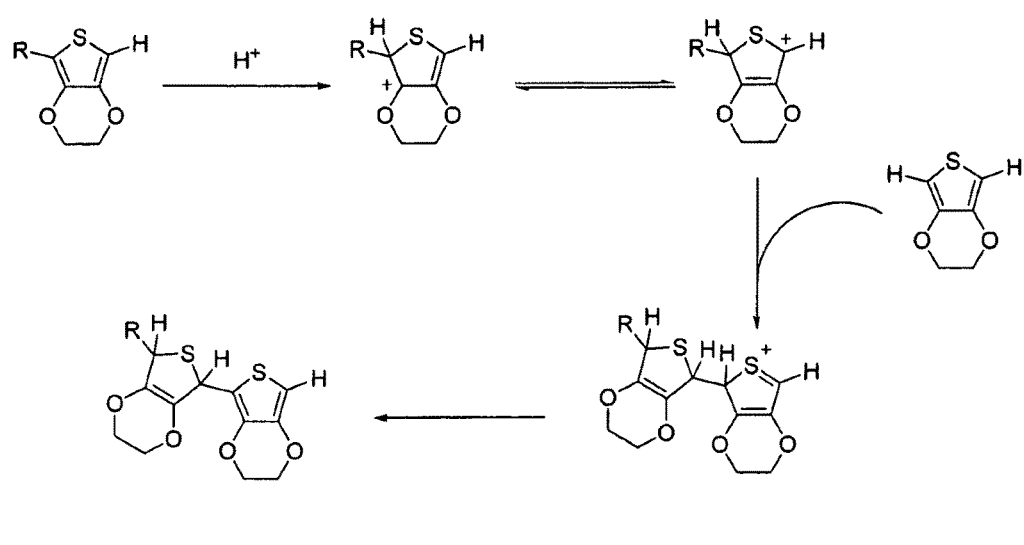
FIG. 12 depicts (A) an acid initiated coupling of 3,4-ethylenedioxythiophene (EDOT), resulting in an non-conjugated polymer (e.g., "R" may be a hydrogen, EDOT or PEDOT); and (B) a trimer with broken conjugation resulting from polymerization under highly acidic conditions.
Figure 12:
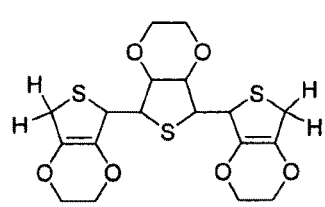

Oxidation of 3,4-ethylenedioxythiophene (EDOT) to form PEDOT is analogous to the oxidative polymerization of pyrrole, which has been described with a mechanism proposed by Diaz and shown in FIG. 11A. (S. Sadki, P. Schottland, N. Brodie, G. Sabouraud *Chemical Society Reviews* 2000, 29, 283; and E. M. Genies, G. Bidan, A. F. Diaz, *Journal of Electroanalytical Chemistry* 1983, 149, 101.) The first step is the oxidation of EDOT, which generates a radical cation that has several resonance forms. The combination of two of these radicals and subsequent deprotonation form a neutral dimer. Substitution of the EDOT thiophene ring at the 3,4-positions blocks β-coupling, allowing new bonds only at the 2,5-positions. The alternating single and double bonds of the dimer give π-conjugated or delocalized electrons, making it easier to remove an electron from the dimer relative to the monomer. In other words, the dimer has a lower oxidation potential than the monomer. The dimer can be oxidized to form another positively charged radical that undergoes coupling and deprotonation with other monomeric or oligomeric cations. Eventually, chains of neutral PEDOT with alternating single and double bonds are formed.

The neutral PEDOT polymer can be further oxidized to create a positive charge along the backbone every three or four chain segments. A "dopant" anion ionically binds to the polymer and balances the charge. The oxidized form of PEDOT, shown in FIG. 11B, is the conducting form of the polymer. Neutral PEDOT has a dark blue/purple color and the doped form is very light blue.

The acidic strength of the reaction environment is one aspect of the mechanism to be considered, because it can have a number of effects on the polymerization conditions, including the oxidation potential of the oxidant, which can be decreased with the addition of a base. Some acidification of the reaction mixture generally speeds the rate of polymerization through an acid-initiated coupling mechanism, shown in FIG. 11A, which contributes to additional chain growth.

One caveat of acid-initiated coupling is that the resulting polymer is not conjugated and will not be electrically conducting without subsequent oxidation. If the acidic strength is too high, it is even possible to saturate the 3,4-positions of a reacting EDOT radical, resulting in a trimer with broken conjugation, shown in FIG. 11B, quenching electrical conductivity. T. F. Otero, J. Rodriguez, Electrochimica Acta 39, 245 (1994).

Evidence has also been presented that very acidic conditions can break the dioxy bridge on the EDOT ring leading to imperfections that reduce conductivity. (B. Winther-Jensen, K. West *Macromolecules* 2004, 37, 4538.) Adding pyridine as a base to the system to achieve an acidic strength strong enough to maintain the oxidation potential of the oxidant, but not strong enough to cause bond cleavage of the monomer, yielded PEDOT films with conductivities reported to be as high as 1000 S/cm.

The proposed mechanism (FIG. 1a) for grafting PEDOT, as disclosed herein, was inspired by Kovacic's report that benzene could be polymerized to form doped polyphenylene using Friedel-Crafts catalysts, such as $AlCl_3$, $CuCl_2$, $FeCl_3$, and $MoCl_5$. (P. Kovacic, M. B. Jones, *Chemical Reviews* 1987, 87, 357.) The Friedel-Crafts catalysts facilitate the formation of radical cations from benzene, toluene, chlorobenzene, phenol, biphenyl, and naphthalene. The Kovacic mechanism has striking similarities with the proposed mechanisms for oxidative polymerization of other conjugated polymers (FIG. 1b) including polypyrrole, polythiophene and PEDOT. J. P. Lock, S. G. Im, K. K. Gleason, *Macromolecules* 2006, 39, 5326; S. Sadki, P. Schottland, N. Brodie, G. Sabouraud, *Chemical Society Reviews* 2000, 29, 283; S. Kirchmeyer, K. Reuter, *J Mater Chem* 2005, 15, 2077; and Y. H. Ha, N. Nikolov, S. K. Pollack, J. Mastrangelo, B. D. Martin, R. Shashidhar, *Advanced Functional Materials* 2004, 14, 615. The main difference is the choice of the aromatic monomer.

Figure 1:
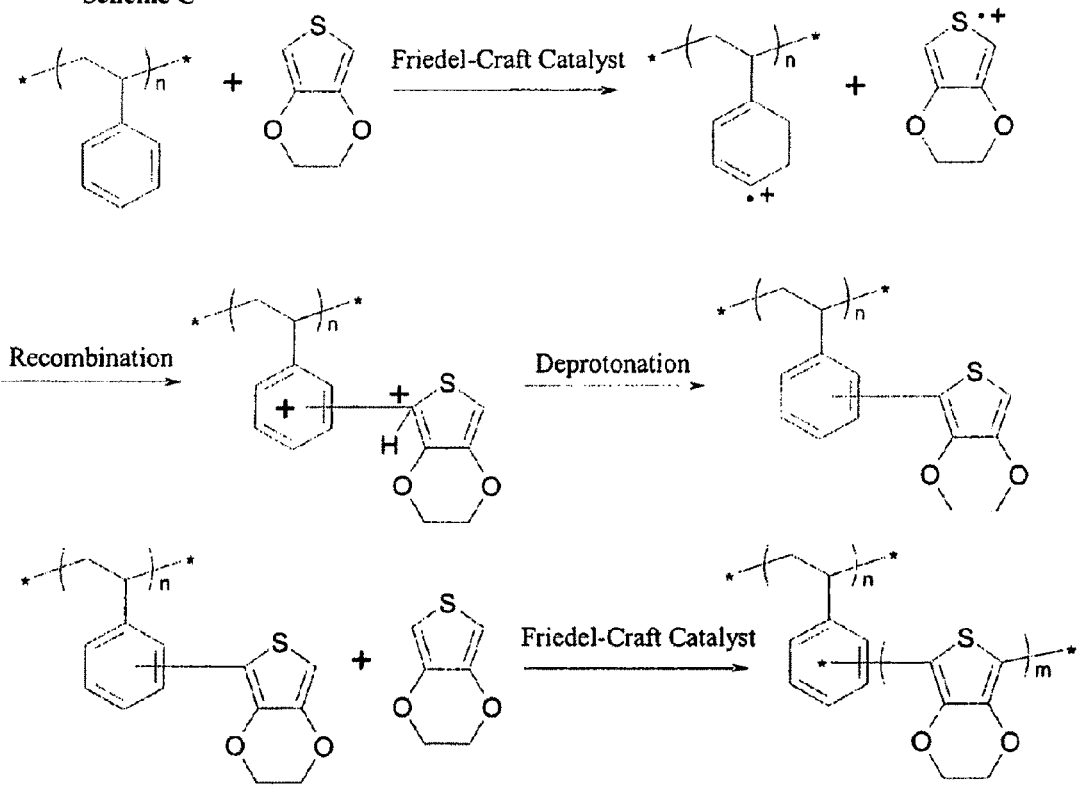
FIG. 1 depicts a reaction mechanism for grafting of PEDOT onto polymer substrates.

Certain aspects of the invention were based on the hypothesis that Kovacic's mechanism could be extended to solid surfaces containing aromatic rings (FIG. 1c). Therefore, if the conditions used to create radical cations from the monomers simultaneously produce radical cations on the substrate, the reaction of these two species by the mechanism shown in FIG. 1c would result in covalent grafting. This attachment scheme forms bonds directly between the substrates containing aromatic rings and the monomer units of the growing conductive polymers without employing any additional linker molecules. The same conditions that give rise to grafting will result in continued propagation of the covalent polymer chain through oxidative polymerization. Both grafting and growth occur in a single synthetic step. In support of this hypothesis, the same conductivity is measured for oCVD films grown on substrates containing aromatic groups (grafted) and on substrates on which no grafting occurs, indicating negligible impact of the grafted layer on electronic properties. Post-deposition rinsing with methanol yields oCVD PEDOT films having negligible Friedel-Crafts catalyst incorporation. (S. G. Im, E. A. Olivetti, K. K. Gleason, *Applied Physics Letters* 2007, 90, 152112.)

For example, as suggested in FIG. 1c, if the radical cation of phenyl group in poly styrene formed by $FeCl_3$ can recombine with the radical cation of EDOT, and a chemical bond can be formed from the poly styrene surface, it will result in grafting of the polymer to the surface. In other words, by repetitive oxidative polymerization reaction of EDOT, the surface grafted EDOT may be polymerized on the poly styrene surface. Because poly styrene is eventually non-volatile, the grafting reaction is confined with the surface of poly styrene layer and following polymer layer is completely PEDOT. Moreover, the grafting reaction forms direct linkage between phenyl ring of the poly styrene and EDOT monomer and no additional linker is needed, which could minimize the generation of impurities during the grafting step. Therefore, the fully grafted conducting polymer can be obtained without any deterioration of chemical and electrical properties of conducting polymer.

Figure 2:
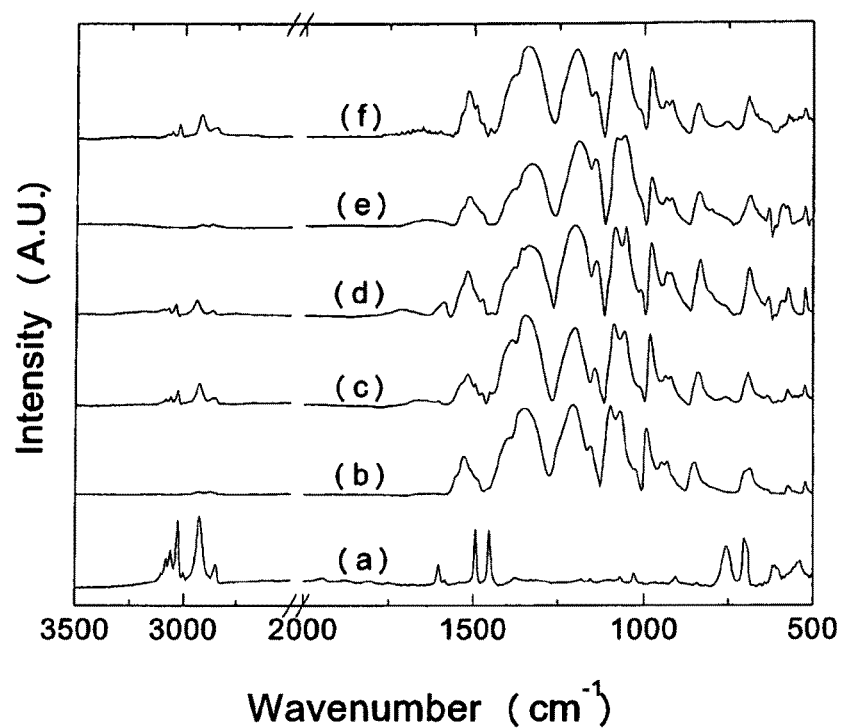
FIG. 2 depicts FT-IR spectra of (a) standard poly styrene (200 nm, MW=250K); (b) oCVD PEDOT (60 nm); (c) ungrafted poly styrene-on-PEDOT; (d) grafted PEDOT-on-poly styrene; (e) ungrafted poly styrene-on-PEDOT after 5 s of rinsing with THF; and (f) grafted PEDOT-on-poly styrene after one hour of soaking in THF.

Fourier transformed infrared (FTIR) spectroscopic analysis (FIG. 2) supports the hypothesis of grafting between an oCVD PEDOT film and a poly styrene substrate. The shaded band centered at ~3000 $cm^{-1}$ of highlights peaks observed in pure poly styrene (FIG. 2a) are absent in pure PEDOT (FIG.

2b). A poly styrene film spun on PEDOT film (termed as poly styrene-on-PEDOT) and oCVD PEDOT deposited on poly styrene film (termed as PEDOT-on-poly styrene) were respectively prepared. The chemical composition of the poly styrene-on-PEDOT is the same as that of PEDOT-on-poly styrene. However, it is hypothesized that only the PEDOT-on-poly styrene sample has a strong chemical grafting between the layers while the poly styrene-on-PEDOT has only a weak physical attachment. The FTIR spectra from bilayer films of PEDOT-on-poly styrene (FIG. 2c) and poly styrene-on-PEDOT (FIG. 2d) peaks are essentially indistinguishable and contain representative peaks for both poly styrene and PEDOT. However, after a 5 s rinse with tetrahydrofuran (THF), a good solvent for poly styrene, the characteristic peaks of poly styrene in FTIR spectrum of the ungrafted poly styrene-on-PEDOT are completely removed (FIG. 2e). On the other hand, the characteristic peaks of poly styrene in the FTIR spectrum of the grafted PEDOT-on-poly styrene (FIG. 2f) were detected even after a one-hour soaking in THF. Considering the high solubility of poly styrene in THF, the retention of poly styrene the grafted PEDOT-on-poly styrene after soaking in THF strongly supports the present of strong covalent bonding between poly styrene and PEDOT. (A. F. M. Barton, *CRC handbook of polymer-liquid interaction parameters and solubility parameters*, CRC Press, 1990.)

Figure 3:
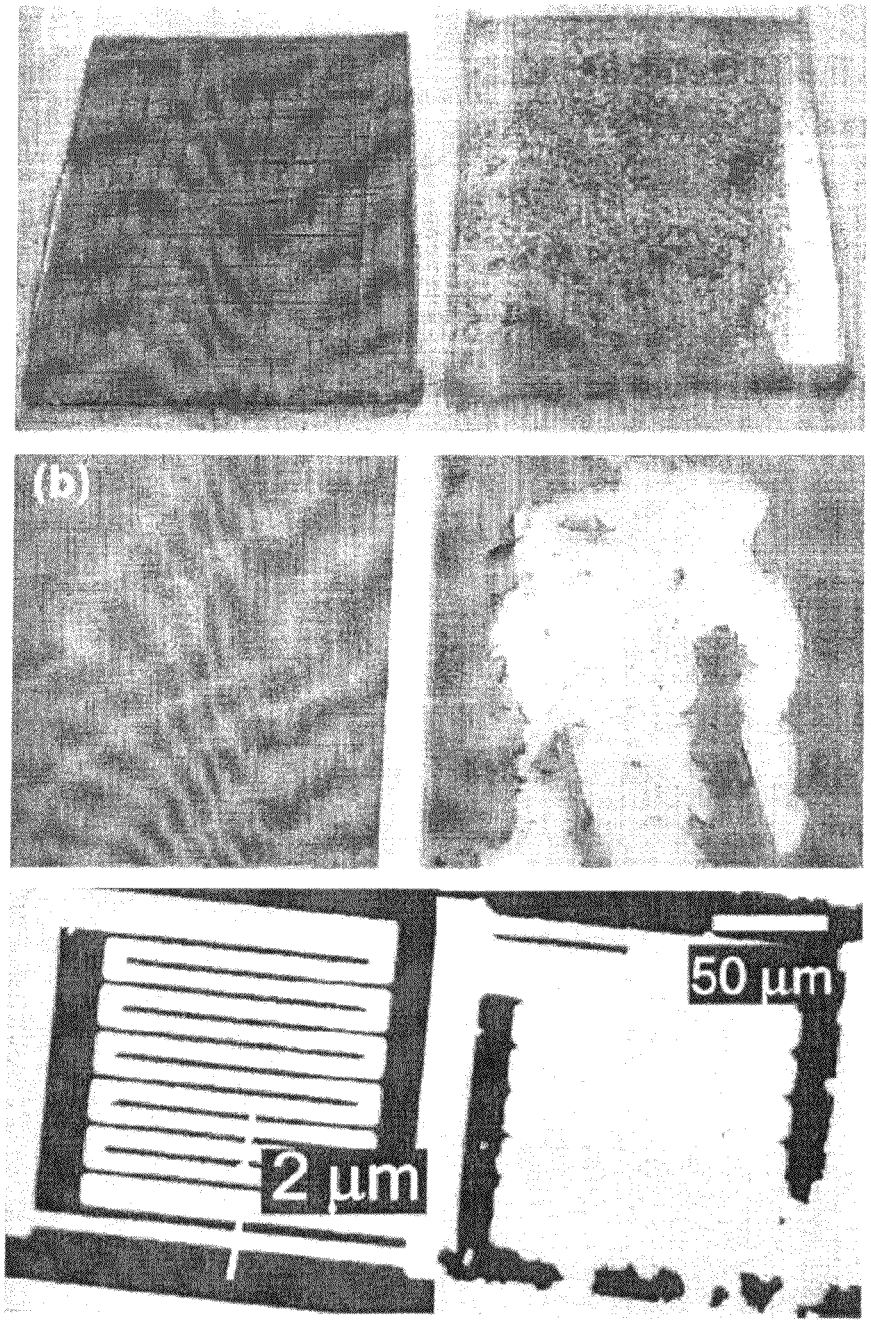
FIG. 3 depicts (a) PEDOT grafted on PET (left) and PEDOT on PP, ungrafted (right) after tape testing; (b) PEDOT grafted (left) and ungrafted (right) on glass after the ultrasonication for 5 min.; and (c) Conventional lift-off photolithography pattern on Si wafers with ungrafted PEDOT (left) and with grafted PEDOT (right). The scale bars represent a length of 50 μm.

The grafting scheme is anticipated to be operable when both the substrate surface and oCVD monomer can be activated with a Friedel-Crafts catalyst. Thus, numerous oxidatively polymerized conductive polymers have the potential to be robustly adhered to substrates containing aromatic groups or to which aromatic groups have been linked. Conversely, no improvement in the adhesion strength should be observed when the substrate is devoid of aromatic groups. Indeed, evaluation of adhesion after tape testing (ASTM D3359-97; *Annual Book of ASTM Standards* D3359, 1997) and ultrasonication confirms the chemical selectivity of the inherent grafting procedure towards different polymeric substrates. FIG. 3a reveals that tape testing resulted in no delamination of PEDOT films inherently grafted to PC. Identical results were obtained for PEDOT on poly styrene, PET, polyethylenenaphthalate (PEN), polyurethane (PU), and poly(acrylonitrile-butadiene-styrene) (ABS), substrates which all contain aromatic functional groups. Additionally, strong adhesion promotion was also observed for oCVD polyaniline and polypyrrole films deposited on PET substrates. As expected for a nonaromatic substrate, severe adhesive failure (FIG. 3a) resulted when the same synthetic procedure and testing was carried out for PEDOT growth onto polypropylene (PP). Delamination was also observed for PEDOT on polyethylene (PE), polytetrafluoroethylene (PTFE), and polyethyleneoxide (PEO) substrates, materials containing no aromatic rings. In contrast, the full thickness of PEDOT film grafted on PET was also retained after ultrasonication in water for 3 hours. No delamination was observed and more than 90% of initial conductivity was retained after the ultrasonication. Most likely, the slight loss in conductivity results from dopant wash-out.

In certain embodiments, enhanced adhesion was also obtained when the grafting technique was expanded to additional types of substrates by introducing linker materials containing active sites for the Friedel-Crafts catalyst. For example, a linker material, phenyltrichlorosilane (PTCS) was used to create phenyl groups covalently linked to glass surfaces. (E. Ruckenstein, Z. F. Li, *Advances in Colloid and Interface Science* 2005, 113, 43.) The presence of phenyl groups at the surface was confirmed by the change of static contact angle with water from less than 10° to 65±2° (data not shown). The resultant grafted oCVD PEDOT film survived one hour of ultrasonication (FIG. 3b). For substrates having bulk compositions devoid of aromatic groups, when the linker was not used, the integrity of the PEDOT film was lost during 5 min of ultrasonication (FIG. 3b). These observations consistently support the hypothesis of grafting through the aromatic group of the linker. Silanes react with various inorganic substrates, including quartz, native oxide on Si wafers, aluminum, copper, stainless steel, as well as glass. (A. F. M. Barton, *CRC handbook of polymer-liquid interaction parameters and solubility parameters*, CRC Press, 1990.) Indeed, all of above-mentioned substrates displayed a similar enhancement of adhesion strength to PEDOT when the linker was employed.

In certain embodiments, grafting of the conducting polymer film to the substrate minimizes delamination problems during patterning as clearly demonstrated by comparing the negative tone patterns on Si for the grafted and ungrafted PEDOT. For the ungrafted case (FIG. 3c, right), acetone caused liftoff of smaller features. However, a well-resolved and complete pattern was successfully obtained from grafted PEDOT (FIG. 3c, left). In previous studies, patterning organic conducting layer were obtained through modification of the standard lithography process. (J. A. DeFranco, B. S. Schmidt, M. Lipson, G. G. Malliaras, *Organic Electronics* 2006, 7, 22.) However, by grafting, well defined PEDOT patterns were easily obtained without any modification of the standard photolithographic lift-off patterning process used for common inorganic metals such as Pt, Cr, and Au. (R. W. Ryan, R. F. Kopf, R. A. Hainm, R. J. Malik, R. Masaitis, R. Opila, *Journal of Vacuum Science & Technology B* 1998, 16, 2759.)

In order to verify the effectiveness of grafting toward enhanced adhesion of PEDOT onto the underlying polymeric layer, surface deformation induced by swelling stress was investigated. A grafted PEDOT/poly styrene bilayer film and an ungrafted PEDOT/PEO bilayer supported on Si wafers were prepared. Upon exposure to the vapor of a selected solvent, the underlying polymeric layer became gradually swells, leading to a considerable volumetric expansion. However, the top surface of PEDOT layer can retain its intrinsic solid-like characteristics during the swelling of the underlying layer, leading to the formation of in-plane compressive stress within the bilayer films of PEDOT/polymer. Eventually, the accumulated compressive stress was released as a generation of surface wrinkles by buckling deformation. (P. J. Yoo, H. H. Lee, *Macromolecules* 2005, 38, 2820; and P. J. Yoo, K. Y. Suh, H. Kang, H. H. Lee, *Physical Review Letters* 2004, 93.)

Figure 4:
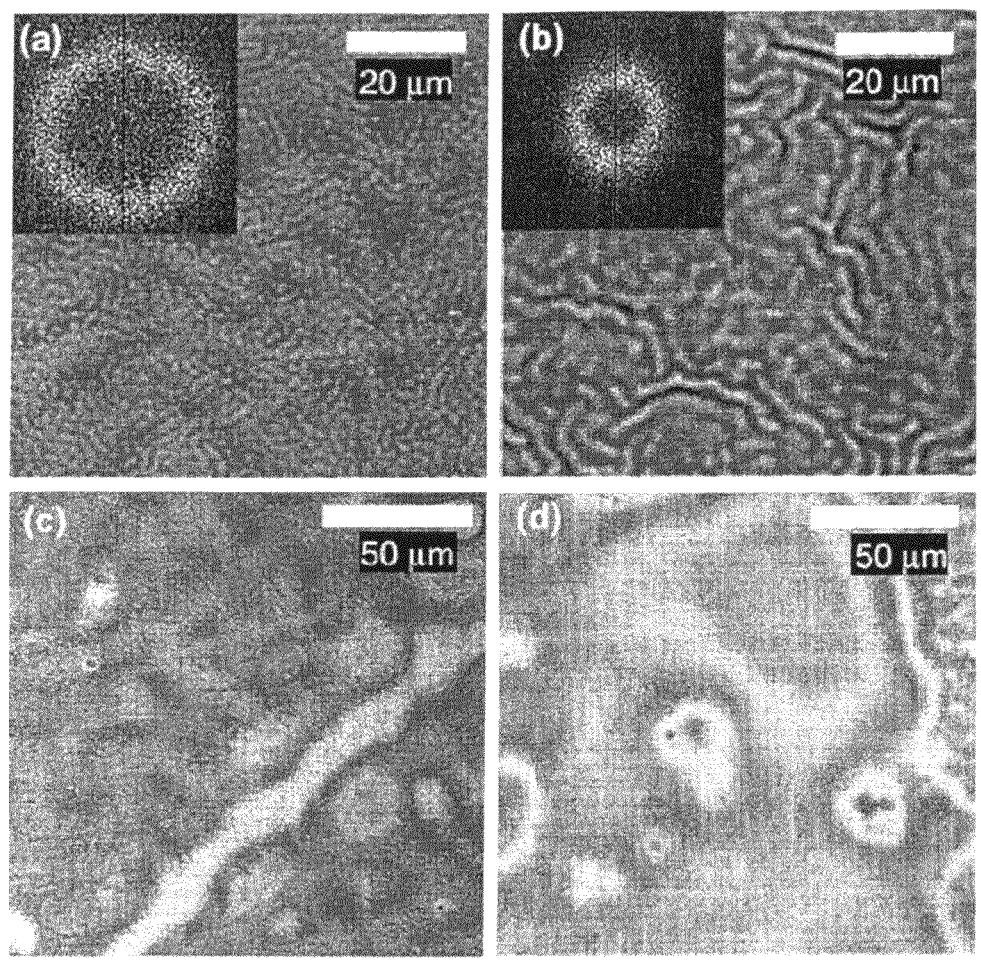
FIG. 4 depicts atomic force microscopy (AFM) images of PEDOT films on poly styrene after treatment with THF vapors for (a) 5 s and (b) 15 s. Rings appearing in the corresponding fast Fourier transforms (insets) indicates that the patterns of surface wrinkles are isotropic and of single length-scale (P. J. Yoo, H. H. Lee, *Macromolecules* 2005, 38, 2820) of 2.1±0.3 μm and 3.9±0.9 μm for (a) and (b), respectively. This uniform wrinkling confirms the strong adhesion of grafted PEDOT on poly styrene. Uniform surface wrinkling is absent in the optical microscope images of the PEDOT films on PEO after treatment with water vapor for (c) 15 min, and (d) 30 min., consistent with the lack of PEDOT grafting to the non-aromatic. PEO layer.

In case of grafted PEDOT film on poly styrene layer (FIGS. 4a and 4b), gradual swelling of poly styrene film by THF solvent could be interpreted from the uniformly generated surface wrinkles. In particular, initial emergence of periodic perturbational waves occurs when the compressive stress exceeds the critical buckling stress. Note that the onset of buckling confirms the presence of strong binding (adhesion) between PEDOT and underlying poly styrene layer, which causes the film to wrinkle uniformly with a specific periodicity over the entire film surface, as demonstrated through Fourier transform analysis, shown as the inserts to FIGS. 4a and 4b. On the other hand, as shown in FIGS. 4c and 4d, swelling of non-grafted PEDOT film on PEO layer results in random deformation of surface. The absence of binding between PEDOT and PEO allows for interfacial slip and results in the non-uniform localization of swollen PEO under the PEDOT layer.

Figure 5:
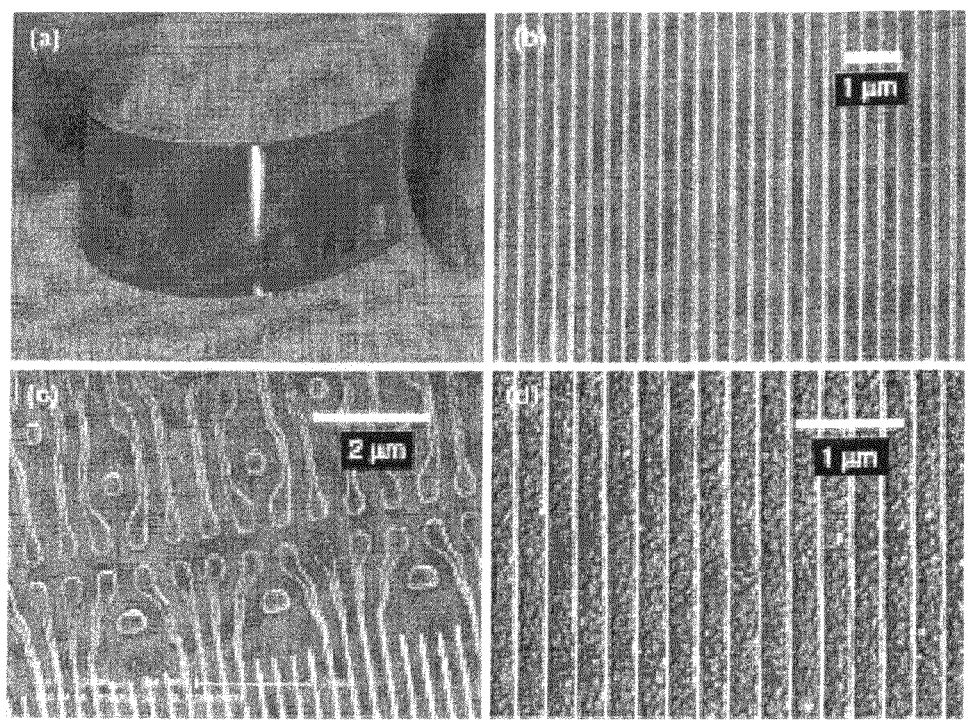
FIG. 5 depicts PEDOT pattern on flexible PET substrate by capillary force lithography; (a) image of patterned PEDOT film on flexible PET substrate; (b) 120 nm line pattern; (c) complex pattern; and (d) 60 nm line pattern of PEDOT film grafted on flexible PET substrate by e-beam lithography.
Figure 6:
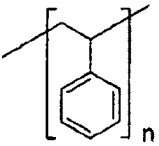
FIG. 6 depicts the structures of poly styrene (poly styrene), poly ethyleneterephthalate (PET), poly carbonate (PC), poly ethylenenaphthalate (PEN), poly urethane (PU), and a copolymer of poly (acrylonitrile-butadiene-styrene) (ABS); wherein n, q, r and s, are all positive integers.
Figure 6:
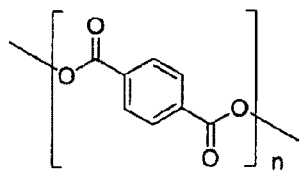
Figure 6:
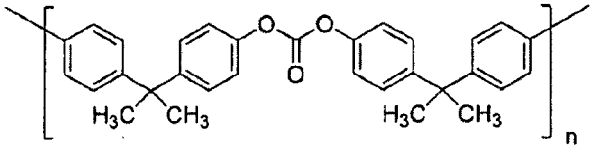
Figure 6:
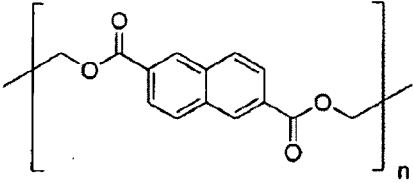
Figure 6:
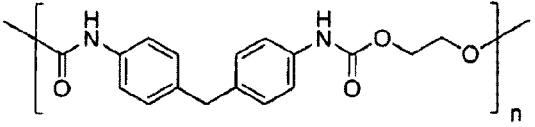
Figure 6:
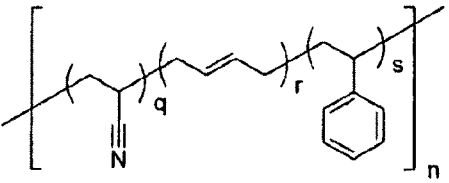
Figure 7:
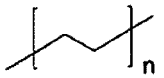
FIG. 7 depicts the structures of poly ethylene (PE), poly propylene (PP), poly tetrafluoroethylene (PTFE), and poly ethyleneoxide (PEO); wherein n is a positive integer.
Figure 7:
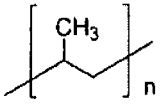
Figure 7:
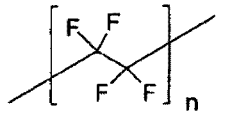
Figure 7:
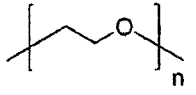
Figure 8:
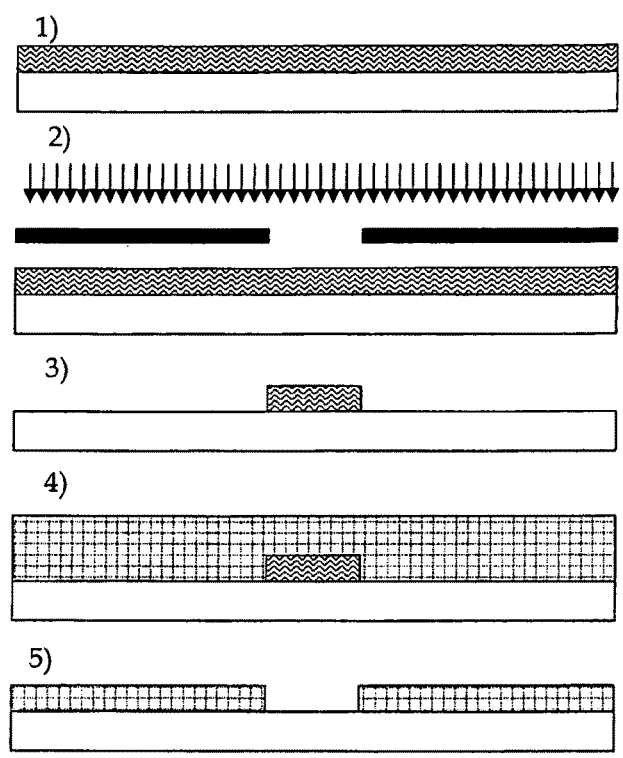
FIG. 8 depicts a method of forming a grafted pattern on polymer substrate: step one involves spin coating a photoregisit (PR, e.g., OCG-825) and prebaking (e.g., a PEO polymer) on a substrate (e.g., a clean silicon wafer); step two involves exposure to ultraviolet light with a photomask; step three involves developing and post-bake complete pattern of PR; step four involves oCVD to form a polymer (e.g., PEDOT) on PR-patterned surface; and step five involves stripping the PR with acetone to complete the pattern.
Figure 9:
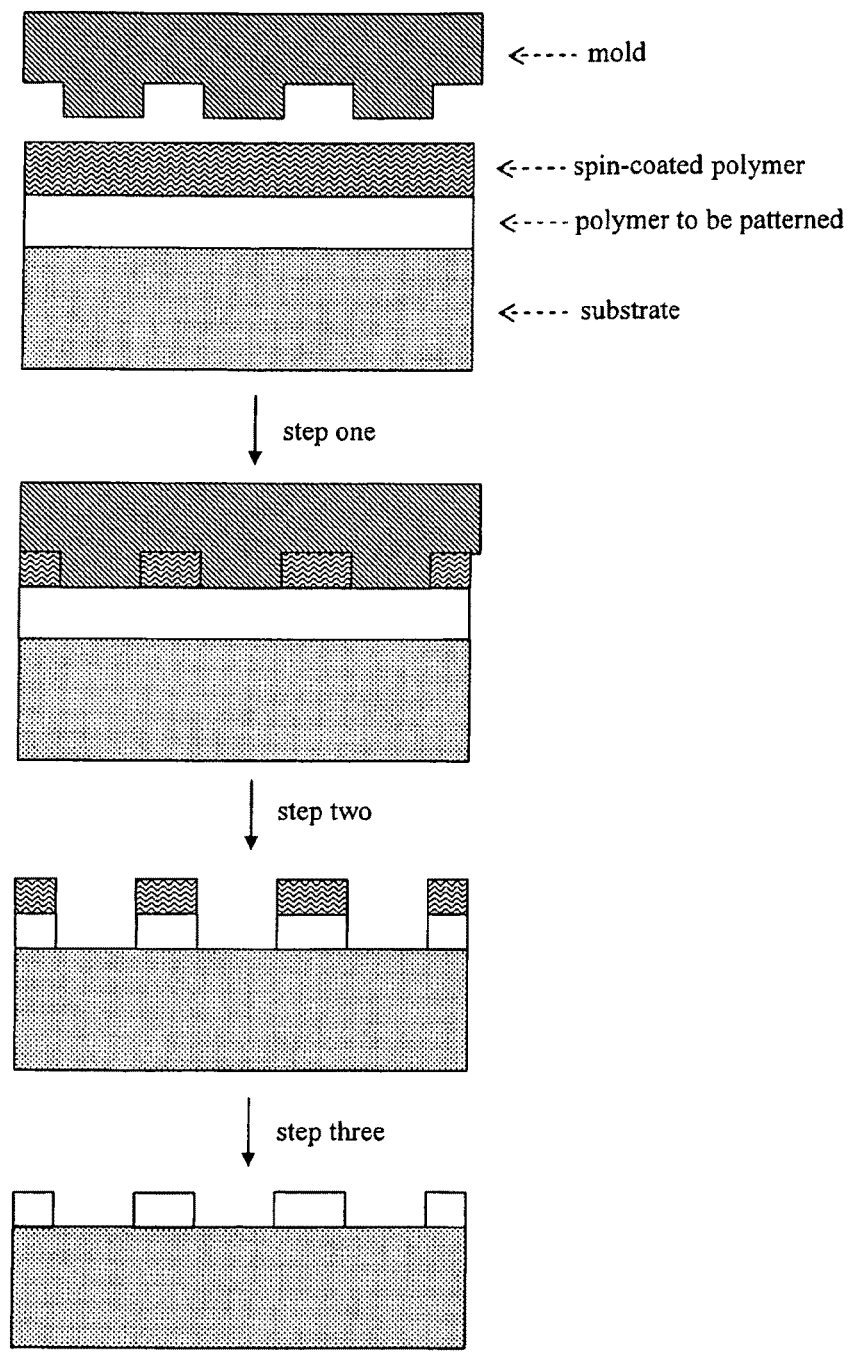
FIG. 9 depicts a method of forming a grafted pattern on polymer substrate: step one involves using a soft lithography mold to pattern a spin-coated polymer (e.g., a poly styrene polymer) on a coated substrate (e.g., a PEDOT coated substrate); step two involves detaching the mold and plasma etching ($O_2$) the exposed coated substrate; and step three involves removing the spin-coated polymer.

The enhanced adhesion by the grafting process can be utilized to obtain well-defined high-density patterns of conducting polymer over the entire surface of the substrate. Three different patterning processes of 1) optical patterning of conventional photolithography, 2) stamping patterning of capillary force lithography, and 3) writing patterning of e-beam lithography were utilized to pattern grafted oCVD conducting polymer films without any modification of standard patterning protocol. All of the independent patterning processes could form very well-defined patterns of PEDOT (FIGS. 3c and 5). FIG. 5 displays patterned PEDOT films grafted on a flexible transparent PET substrate. The low surface roughness of oCVD PEDOT (root mean square roughness is less than 3 nm) allows high-density patterns to be obtained from capillary force lithography, over an area of 2 mm×3 mm with minimum feature size down to 120 nm on flexible PET substrates. (K. Y. Suh, H. H. Lee, *Advanced Functional Materials* 2002, 12, 405.) A variety of patterns (FIGS. 5b to 5d) are readily resolved on flexible polymer substrates without any notable regions of failure. Furthermore, finer feature size pattern can also be obtained via e-beam writing lithography, and well defined 60 nm lines were successfully obtained (FIG. 5d) in PEDOT grafted onto flexible PET substrate.

In sum, grafting of conducting polymer films (for example: PEDOT, polypyrrole, and polyaniline) on aromatic organic substrates was successfully obtained via a linker-free one-step oCVD process. This grafting scheme relies on the ability of the Friedel-Crafts catalyst to form radical cations on the substrate under the conditions oCVD conducting polymer growth. The grafted film exhibited a dramatic increase in adhesion strength. By using silane coupling agents containing an aromatic ring, the grafting process can also be extended to common inorganic substrates such as aluminum and glass. With directly grafted PEDOT, 60 nm features sizes were obtained on flexible and transparent polymeric substrates. The ability to graft conducting polymers on common substrates has the potential to revolutionize the fabrication of integrated circuitry for flexible electronics. This easy, one-step grafting process offers a wide process window and versatility in applications to various flexible substrates. In particular, this linker-free technique eliminates the tedious additional processes for grafting and opens up the possibility of mass-production of grafted flexible conducting layers at low cost.

Definitions

For convenience, certain terms employed in the specification, examples, and appended claims are collected here.

"PEDOT" as used herein is an abbreviation for poly-3,4-ethylenedioxythiophene.

"EDOT" as used herein is an abbreviation for the monomer 3,4-ethylenedioxythiophene.

"CVD" as used herein is an abbreviation for chemical vapor deposition.

As used herein, the term "surface" or "surfaces" or "substrates" can mean any surface of any material, including glass, plastics, metals, polymers, paper, fabric and the like. It can include surfaces constructed out of more than one material, including coated surfaces. Importantly, all surfaces/substrates of the invention can react with the oxidants/catalysts of the invention, resulting in the covalent attachment of the polymer coating to the surface/substrate.

A "dopant anion," as used herein, provides stability enhancement for electroactive polymers. The dopant may be any compound as long as it has a doping ability (i.e., stabilizing ability). For example, an organic sulfonic acid, an inorganic sulfonic acid, an organic carboxylic acid or salts thereof, such as a metal salt or an ammonium salt may be used. The method for adding the dopant is not limited and the compound may be added to the oxidizing agent and/or the monomer, may be allowed to be present together at the time of polymerization or may be added by other methods. In certain embodiments, the dopant molecule comprises aqueous solutions of the acids selected from the group consisting of phosphoric acid, triflic acid, hydrochloric acid, methanesulfonic acid, oxalic acid, pyruvic acid, and acrylic acid, or a poly anion incorporating one or more of the aforementioned types of acids.

The term "heteroatom" is art-recognized and refers to an atom of any element other than carbon or hydrogen. Illustrative heteroatoms include boron, nitrogen, oxygen, phosphorus, sulfur and selenium.

The term "alkyl" is art-recognized, and includes saturated aliphatic groups, including straight-chain alkyl groups, branched-chain alkyl groups, cycloalkyl (alicyclic) groups, alkyl substituted cycloalkyl groups, and cycloalkyl substituted alkyl groups. In certain embodiments, a straight chain or branched chain alkyl has about 30 or fewer carbon atoms in its backbone (e.g., $C_1$-$C_{30}$ for straight chain, $C_3$-$C_{30}$ for branched chain), and alternatively, about 20 or fewer. Likewise, cycloalkyls have from about 3 to about 10 carbon atoms in their ring structure, and alternatively about 5, 6 or 7 carbons in the ring structure.

Unless the number of carbons is otherwise specified, "lower alkyl" refers to an alkyl group, as defined above, but having from one to about ten carbons, alternatively from one to about six carbon atoms in its backbone structure. Likewise, "lower alkenyl" and "lower alkynyl" have similar chain lengths.

As used here "-alkyl" refers to a radical, such as —$CH_2CH_3$, while "-alkyl-" refers to a diradical, such as —$CH_2CH_2$—.

The term "aralkyl" is art-recognized and refers to an alkyl group substituted with an aryl group (e.g., an aromatic or heteroaromatic group).

The terms "alkenyl" and "alkynyl" are art-recognized and refer to unsaturated aliphatic groups analogous in length and possible substitution to the alkyls described above, but that contain at least one double or triple bond respectively.

The term "aryl" is art-recognized and refers to 5-, 6- and 7-membered single-ring aromatic groups that may include from zero to four heteroatoms, for example, benzene, naphthalene, anthracene, pyrene, pyrrole, furan, thiophene, imidazole, oxazole, thiazole, triazole, pyrazole, pyridine, pyrazine, pyridazine and pyrimidine, and the like. Those aryl groups having heteroatoms in the ring structure may also be referred to as "aryl heterocycles" or "heteroaromatics." The aromatic ring may be substituted at one or more ring positions with such substituents as described above, for example, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, sulfonyl, sulfonamido, ketone, aldehyde, ester, heterocyclyl, aromatic or heteroaromatic moieties, —$CF_3$, —CN, or the like.

Further, the term "aryl" also includes polycyclic systems of aromatic rings, such as naphthalene. Examples of such ring systems include

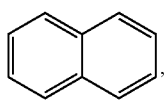 , 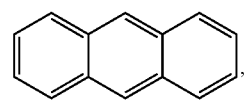 ,

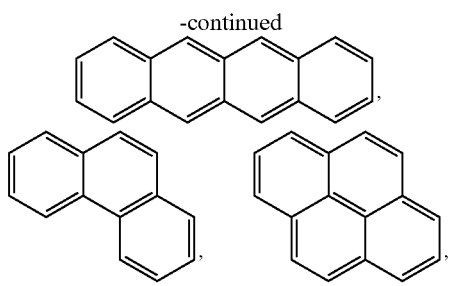

and the like.

The term "aryl" also includes polycyclic ring systems having two or more cyclic rings in which two or more carbons are common to two adjoining rings (the rings are "fused rings") wherein at least one of the rings is aromatic, e.g., the other cyclic rings may be cycloalkyls, cycloalkenyls, cycloalkynyls, aryls and/or heterocyclyls.

The terms ortho, meta and para are art-recognized and refer to 1,2-, 1,3- and 1,4-disubstituted benzenes, respectively. For example, the names 1,2-dimethylbenzene and ortho-dimethylbenzene are synonymous.

The terms "heterocyclyl", "heteroaryl", or "heterocyclic group" are art-recognized and refer to 3- to about 10-membered ring structures, alternatively 3- to about 7-membered rings, whose ring structures include one to four heteroatoms. Heterocycles may also be polycycles. Heterocyclyl groups include, for example, thiophene, thianthrene, furan, pyran, isobenzofuran, chromene, xanthene, phenoxanthene, pyrrole, imidazole, pyrazole, isothiazole, isoxazole, pyridine, pyrazine, pyrimidine, pyridazine, indolizine, isoindole, indole, indazole, purine, quinolizine, isoquinoline, quinoline, phthalazine, naphthyridine, quinoxaline, quinazoline, cinnuioline, pteridine, carbazole, carboline, phenanthridine, acridine, pyrimidine, phenanthroline, phenazine, phenarsazine, phenothiazine, furazan, phenoxazine, pyrrolidine, oxolane, thiolane, oxazole, piperidine, piperazine, morpholine, lactones, lactams, such as azetidinones and pyrrolidinones, sultams, sultones, and the like. The heterocyclic ring may be substituted at one or more positions with such substituents as described above, as for example, halogen, alkyl, aralkyl, alkenyl, alkynyl, cycloalkyl, hydroxyl, amino, nitro, sulfhydryl, imino, amido, phosphonate, phosphinate, carbonyl, carboxyl, silyl, ether, alkylthio, sulfonyl, ketone, aldehyde, ester, a heterocyclyl, an aromatic or heteroaromatic moiety, —CF$_3$, —CN, or the like.

The terms "polycyclyl" or "polycyclic group" are art-recognized and refer to two or more rings (e.g., cycloalkyls, cycloalkenyls, cycloalkynyls, aryls and/or heterocyclyls) in which two or more carbons are common to two adjoining rings, e.g., the rings are "fused rings". Rings that are joined through non-adjacent atoms are termed "bridged" rings. Each of the rings of the polycycle may be substituted with such substituents as described above, as for example, halogen, alkyl, aralkyl, alkenyl, alkynyl, cycloalkyl, hydroxyl, amino, nitro, sulfhydryl, imino, amido, phosphonate, phosphinate, carbonyl, carboxyl, silyl, ether, alkylthio, sulfonyl, ketone, aldehyde, ester, a heterocyclyl, an aromatic or heteroaromatic moiety, —CF$_3$, —CN, or the like.

Analogous substitutions may be made to alkenyl and alkynyl groups to produce, for example, aminoalkenyls, aminoalkynyls, amidoalkenyls, amidoalkynyls, iminoalkenyls, iminoalkynyls, thioalkenyls, thioalkynyls, carbonyl-substituted alkenyls or alkynyls.

The term "carbocycle" is art-recognized and refers to an aromatic or non-aromatic ring in which each atom of the ring is carbon.

The term "nitro" is art-recognized and refers to —NO$_2$; the term "halogen" is art-recognized and refers to —F, —Cl, —Br or —I; the term "sulfhydryl" is art-recognized and refers to —SH; the term "hydroxyl" means —OH; and the term "sulfonyl" is art-recognized and refers to —SO$_2^-$. "Halide" designates the corresponding anion of the halogens, and "pseudohalide" has the definition set forth on page 560 of "Advanced Inorganic Chemistry" by Cotton and Wilkinson.

The terms "amine" and "amino" are art-recognized and refer to both unsubstituted and substituted amines, e.g., a moiety that may be represented by the general formulas:

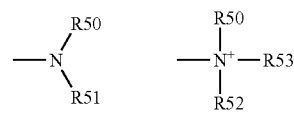

wherein R50, R51, R52 and R53 each independently represent a hydrogen, an alkyl, an alkenyl, —(CH$_2$)$_m$—R61, or R50 and R51 or R52, taken together with the N atom to which they are attached complete a heterocycle having from 4 to 8 atoms in the ring structure; R61 represents an aryl, a cycloalkyl, a cycloalkenyl, a heterocycle or a polycycle; and m is zero or an integer in the range of 1 to 8. In other embodiments, R50 and R51 (and optionally R52) each independently represent a hydrogen, an alkyl, an alkenyl, or —(CH$_2$)$_m$—R61. Thus, the term "alkylamine" includes an amine group, as defined above, having a substituted or unsubstituted alkyl attached thereto, i.e., at least one of R50 and R51 is an alkyl group.

The term "acylamino" is art-recognized and refers to a moiety that may be represented by the general formula:

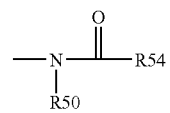

wherein R50 is as defined above, and R54 represents a hydrogen, an alkyl, an alkenyl or —(CH$_2$)$_m$—R61, where m and R61 are as defined above.

The term "amido" is art recognized as an amino-substituted carbonyl and includes a moiety that may be represented by the general formula:

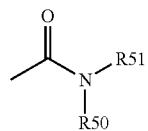

wherein R50 and R51 are as defined above. Certain embodiments, of the amide in the present invention will not include imides which may be unstable.

The term "alkylthio" refers to an alkyl group, as defined above, having a sulfur radical attached thereto. In certain embodiments, the "alkylthio" moiety is represented by one of —S-alkyl, —S-alkenyl, —S-alkynyl, and —S—(CH$_2$)$_m$—

R61, wherein m and R61 are defined above. Representative alkylthio groups include methylthio, ethyl thio, and the like.

The term "carboxyl" is art recognized and includes such moieties as may be represented by the general formulas:

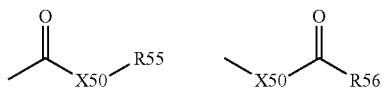

wherein X50 is a bond or represents an oxygen or a sulfur, and R55 and R56 represents a hydrogen, an alkyl, an alkenyl, —(CH$_2$)$_m$—R61 or a pharmaceutically acceptable salt, R56 represents a hydrogen, an alkyl, an alkenyl or —(CH$_2$)$_m$—R61, where m and R61 are defined above. Where X50 is an oxygen and R55 or R56 is not hydrogen, the formula represents an "ester". Where X50 is an oxygen, and R55 is as defined above, the moiety is referred to herein as a carboxyl group, and particularly when R55 is a hydrogen, the formula represents a "carboxylic acid". Where X50 is an oxygen, and R56 is hydrogen, the formula represents a "formate". In general, where the oxygen atom of the above formula is replaced by sulfur, the formula represents a "thiolcarbonyl" group. Where X50 is a sulfur and R55 or R56 is not hydrogen, the formula represents a "thiolester." Where X50 is a sulfur and R55 is hydrogen, the formula represents a "thiolcarboxylic acid." Where X50 is a sulfur and R56 is hydrogen, the formula represents a "thiolformate." On the other hand, where X50 is a bond, and R55 is not hydrogen, the above formula represents a "ketone" group. Where X50 is a bond, and R55 is hydrogen, the above formula represents an "aldehyde" group.

The term "carbamoyl" refers to —O(C═O)NRR', where R and R' are independently H, aliphatic groups, aryl groups or heteroaryl groups.

The term "oxo" refers to a carbonyl oxygen (═O).

The terms "oxime" and "oxime ether" are art-recognized and refer to moieties that may be represented by the general formula:

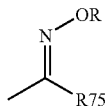

wherein R75 is hydrogen, alkyl, cycloalkyl, alkenyl, alkynyl, aryl, aralkyl, or —(CH$_2$)$_m$—R61. The moiety is an "oxime" when R is H; and it is an "oxime ether" when R is alkyl, cycloalkyl, alkenyl, alkynyl, aryl, aralkyl, or —(CH$_2$)$_m$—R61.

The terms "alkoxyl" or "alkoxy" are art-recognized and refer to an alkyl group, as defined above, having an oxygen radical attached thereto. Representative alkoxyl groups include methoxy, ethoxy, propyloxy, tert-butoxy and the like. An "ether" is two hydrocarbons covalently linked by an oxygen. Accordingly, the substituent of an alkyl that renders that alkyl an ether is or resembles an alkoxyl, such as may be represented by one of —O-alkyl, —O-alkenyl, —O-alkynyl, —O—(CH$_2$)$_m$—R61, where m and R61 are described above.

The term "sulfonate" is art recognized and refers to a moiety that may be represented by the general formula:

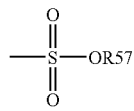

in which R57 is an electron pair, hydrogen, alkyl, cycloalkyl, or aryl.

The term "sulfate" is art recognized and includes a moiety that may be represented by the general formula:

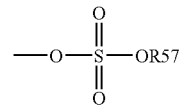

in which R57 is as defined above.

The term "sulfonamido" is art recognized and includes a moiety that may be represented by the general formula:

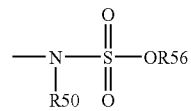

in which R50 and R56 are as defined above.

The term "sulfamoyl" is art-recognized and refers to a moiety that may be represented by the general formula:

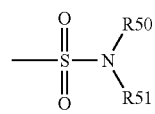

in which R50 and R51 are as defined above.

The term "sulfonyl" is art-recognized and refers to a moiety that may be represented by the general formula:

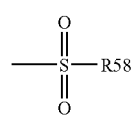

in which R58 is one of the following: hydrogen, alkyl, alkenyl, alkynyl, cycloalkyl, heterocyclyl, aryl or heteroaryl.

The term "sulfoxido" is art-recognized and refers to a moiety that may be represented by the general formula:

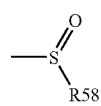

in which R58 is defined above.

The term "phosphoryl" is art-recognized and may in general be represented by the formula:

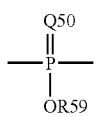

wherein Q50 represents S or O, and R59 represents hydrogen, a lower alkyl or an aryl. When used to substitute, e.g., an alkyl, the phosphoryl group of the phosphorylalkyl may be represented by the general formulas:

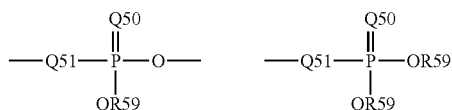

wherein Q50 and R59, each independently, are defined above, and Q51 represents O, S or N. When Q50 is S, the phosphoryl moiety is a "phosphorothioate".

The term "phosphoramidite" is art-recognized and may be represented in the general formulas:

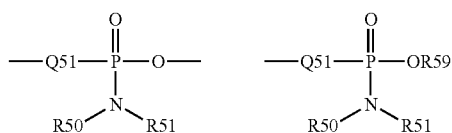

wherein Q51, R50, R51 and R59 are as defined above.

The term "phosphonamidite" is art-recognized and may be represented in the general formulas:

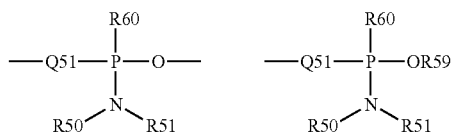

wherein Q51, R50, R51 and R59 are as defined above, and R60 represents a lower alkyl or an aryl.

The term "selenoalkyl" is art-recognized and refers to an alkyl group having a substituted seleno group attached thereto. Exemplary "selenoethers" which may be substituted on the alkyl are selected from one of —Se-alkyl, —Se-alkenyl, —Se-alkynyl, and —Se—$(CH_2)_m$—R61, m and R61 being defined above.

The definition of each expression, e.g., alkyl, m, n, and the like, when it occurs more than once in any structure, is intended to be independent of its definition elsewhere in the same structure.

The abbreviations Me, Et, Ph, Tf, Nf, Ts, and Ms represent methyl, ethyl, phenyl, trifluoromethanesulfonyl, nonafluorobutanesulfonyl, p-toluenesulfonyl and methanesulfonyl, respectively. A more comprehensive list of the abbreviations utilized by organic chemists of ordinary skill in the art appears in the first issue of each volume of the Journal of Organic Chemistry; this list is typically presented in a table entitled Standard List of Abbreviations.

It will be understood that "substitution" or "substituted with" includes the implicit proviso that such substitution is in accordance with permitted valence of the substituted atom and the substituent, and that the substitution results in a stable compound, e.g., which does not spontaneously undergo transformation, such as by rearrangement, cyclization, elimination, or other reaction.

The term "substituted" is also contemplated to include all permissible substituents of organic compounds. In a broad aspect, the permissible substituents include acyclic and cyclic, branched and unbranched, carbocyclic and heterocyclic, aromatic and nonaromatic substituents of organic compounds. Illustrative substituents include, for example, those described herein above. The permissible substituents may be one or more and the same or different for appropriate organic compounds. For purposes of this invention, the heteroatoms, such as nitrogen may have hydrogen substituents and/or any permissible substituents of organic compounds described herein which satisfy the valences of the heteroatoms. This invention is not intended to be limited in any manner by the permissible substituents of organic compounds.

For purposes of this invention, the chemical elements are identified in accordance with the Periodic Table of the Elements, CAS version, "Handbook of Chemistry and Physics", 67th Ed., 1986-87, inside cover.

The phrase "polydispersity index" refers to the ratio of the "weight average molecular weight" to the "number average molecular weight" for a particular polymer; it reflects the distribution of individual molecular weights in a polymer sample.

The phrase "weight average molecular weight" refers to a particular measure of the molecular weight of a polymer. The weight average molecular weight is calculated as follows: determine the molecular weight of a number of polymer molecules; add the squares of these weights; and then divide by the total weight of the molecules.

The phrase "number average molecular weight" refers to a particular measure of the molecular weight of a polymer. The number average molecular weight is the common average of the molecular weights of the individual polymer molecules. It is determined by measuring the molecular weight of n polymer molecules, summing the weights, and dividing by n.

Oxidative Chemical Vapor Deposition (oCVD)

Oxidative chemical vapor deposition generally takes place in a reactor. Precursor molecules, consisting of a chemical metal-containing oxidant and a monomer species, are fed into the reactor. This process can take place at a range of pressures from atmospheric pressure to low vacuum. In certain embodiments, the pressure is about 760 torr; in other embodiments, the pressure is about 300 torr; in other embodiments, the pressure is about 30 torr; in other embodiments, the pressure is about 3000 mtorr; in yet other embodiments, the pressure is about 300 mtorr.

Figure 10:
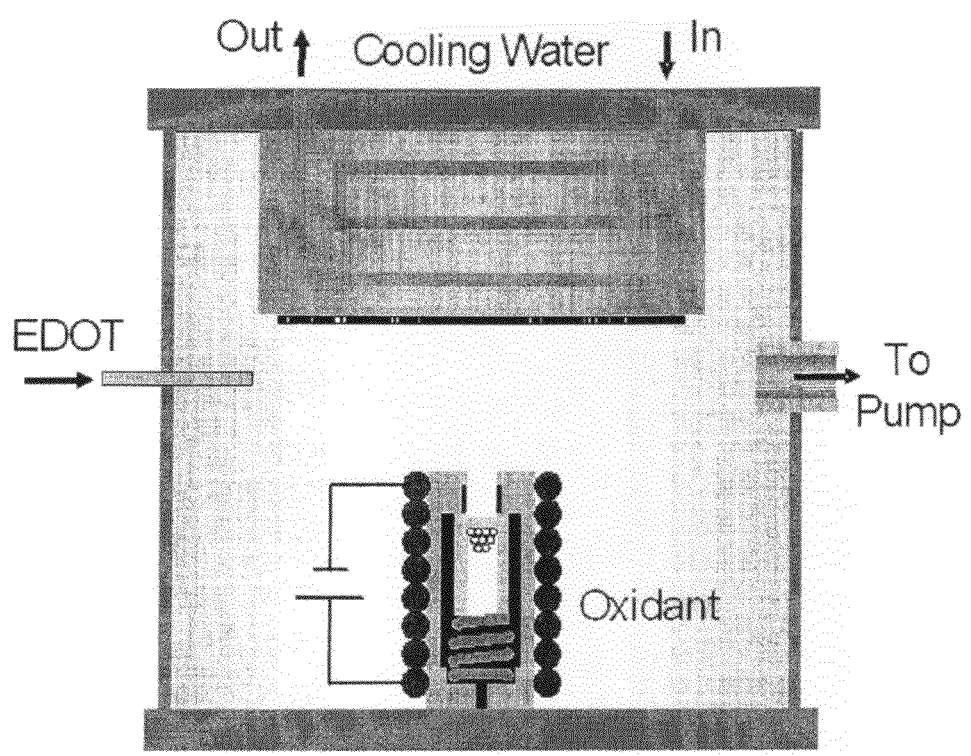
FIG. 10 depicts a schematic chemical vapor deposition (CVD) reactor for depositing films (e.g., PEDOT films).

Chemical metal-containing oxidant species are extremely heavy, but can be sublimed onto a substrate surface using a carrier gas and a heated, porous crucible installed inside the reactor directly above the sample stage (FIG. 10). The oxidant source can also be installed on the exterior of the vacuum chamber. Evaporation of the oxidant can also take place in a resistively heated container inside the reaction chamber. In certain embodiments, evaporation of the oxidant takes place in a resistively heated container inside the reaction chamber underneath the substrate surface to be coated. In certain embodiments, the monomer species may be delivered from a source external to the reactor. The metal-containing oxidant forms a thin, conformational layer on the substrate surface, which reacts with monomer molecules as they adsorb.

Unfortunately an acid-catalyzed side reaction leading to broken monomer bonds and non-conjugated oligomers inhibits the formation of conjugated, electrically active polymer. However, these side reactions may be reduced using one or more the following techniques: introducing a base, such as pyridine, to react with any acid that is formed in situ; heating the substrate to temperatures above about 60° C., 70° C., 80° C. or 90° C., for example, to accelerate evaporation of the acid as it is formed; and biasing the substrate with a positive charge using a DC power supply to favor the oxidation of monomeric and oligomeric species adsorbed on the substrate. Biasing also provided directionality to charged oligomers during polymer chain growth. The ordering of the polymer chains that results is expected to contribute to higher electrical conductivities.

In certain embodiments, the deposited film then may be heated, sometimes under vacuum (e.g., 15 mmHg, 30 mmHg, or 45 mmHg), to remove unreacted monomer. In certain embodiments, rinsing the dried film in a solvent like methanol or water can remove reacted metal-containing oxidant from the film, in some cases changing the color from hazy yellow to a clear sky blue hue. In certain embodiments, rinsing the dried film in a solution of "dopant" ionic salts, such as $NOPF_6$ in acetonitrile, can promote the oxidized form of a conducting polymer by balancing positive charges that are induced along the polymer chain with anions from the salt.

Polymer-Coated Surfaces of the Invention

One aspect of the invention relates to a composition comprising a surface and a polymer coating; wherein said surface comprises aryl or heteroaryl moieties; said polymer coating comprises aryl or heteroaryl moieties; and said surface and said polymer coating are connected via a covalent bond between said aryl and heteroaryl moieties. In other words, certain aspects of the invention relate to a coated surface wherein said coating and said surface are covalently connected through an aryl-aryl, aryl-heteroaryl or heteroaryl-heteroaryl bond.

Another aspect of the invention relates to a composition comprising a polymer coating on a surface; wherein said polymer coating comprises polymerized optionally-substituted heteroaryls selected from the group consisting of thiophenes, furans, pyrroles, and anilines; said surface comprises aryl or heteroaryl moieties; and said surface and said polymer coating are connected via a covalent bond between the polymerized optionally-substituted heteroaryls of the polymer coating and the aryl or heteroaryl moieties of the surface.

Another aspect of the invention relates to a composition comprising a polymer coating on a surface; wherein said polymer coating comprises polymerized optionally-substituted heteroaryls selected from the group consisting of thiophenes; said surface comprises aryl or heteroaryl moieties; and said surface and said polymer coating are connected via a covalent bond between the polymerized optionally-substituted heteroaryls of the polymer coating and the aryl or heteroaryl moieties of the surface.

In certain embodiments, the present invention relates to any one of the aforementioned compositions, wherein said polymer coating comprises optionally substituted thiophenes.

In certain embodiments, the present invention relates to any one of the aforementioned compositions, wherein said coating is of a substantially uniform thickness.

In certain embodiments, the present invention relates to any one of the aforementioned compositions, wherein said thickness does not vary more than 10% over the surface.

In certain embodiments, the present invention relates to any one of the aforementioned compositions, wherein said thickness does not vary more than 5% over the surface.

In certain embodiments, the present invention relates to any one of the aforementioned compositions, wherein said thickness does not vary more than 1% over the surface.

In certain embodiments, the present invention relates to any one of the aforementioned compositions, wherein said polymer coating has a mass per surface area of less than about 500 $\mu g/cm^2$.

In certain embodiments, the present invention relates to any one of the aforementioned compositions, wherein said polymer coating has a mass per surface area of less than about 100 $\mu g/cm^2$.

In certain embodiments, the present invention relates to any one of the aforementioned compositions, wherein said polymer coating has a mass per surface area of less than about 50 $\mu g/cm^2$.

In certain embodiments, the present invention relates to any one of the aforementioned compositions, wherein said polymer coating has a mass per surface area of less than about 10 $\mu g/cm^2$.

In certain embodiments, the present invention relates to any one of the aforementioned compositions, wherein said polymer coating has a mass per surface area of less than about 5 $\mu g/cm^2$.

Note that the required mass per surface area depends on the specific surface area of the substrate to be coated. A smooth flat substrate, 1 $cm^2$ in area requires coverage of only 1 $cm^2$ of area and thus the specific surface area of 1 $cm^2/cm^2$. However, a 1 $cm^2$ section of fabric has a specific surface area greater than 1 because each surface-accessible fiber of the fabric must be coated. The gaseous reactants of the inventive processes are able to penetrate into the fabric and coat these internal surfaces. The specific surface area will depend on the packing density of the fibers and total thickness of the fabric. The thickness (cm) of the coating multiplied by the specific surface area ($cm^2/cm^2$) of the fabric and the density of the coating ($g/cm^3$) will yield the mass per surface area ($g/cm^2$).

In certain embodiments, the present invention relates to any one of the aforementioned compositions, wherein said polymer coating is conductive.

In certain embodiments, the present invention relates to any one of the aforementioned compositions, wherein said polymer coating has a conductivity of between about 100 S/cm and about 200 S/cm.

In certain embodiments, the present invention relates to any one of the aforementioned compositions, wherein said polymer coating has a conductivity of between about 150 S/cm and about 200 S/cm.

In certain embodiments, the present invention relates to any one of the aforementioned compositions, wherein said surface further comprises a gaseous metal-containing oxidant selected from the group consisting of iron(II) chloride, iron(III) toslyate, potassium iodate, potassium chromate, ammonium sulfate and tetrabutylammonium persulfate.

In certain embodiments, the present invention relates to any one of the aforementioned compositions, wherein said gaseous metal-containing oxidant is iron(III) chloride.

In certain embodiments, the present invention relates to any one of the aforementioned compositions, wherein said gaseous metal-containing oxidant has an oxidation potential between about 0.5 V and about 1.0 V.

In certain embodiments, the present invention relates to any one of the aforementioned compositions, wherein said gaseous metal-containing oxidant has an oxidation potential of about 0.75 V.

In certain embodiments, the present invention relates to any one of the aforementioned compositions, further comprising a dopant anion.

In certain embodiments, the present invention relates to any one of the aforementioned compositions, wherein said dopant anion is selected from the group consisting of chloride, bromide, iodide, fluoride, phosphate and sulfonate.

In certain embodiments, the present invention relates to any one of the aforementioned compositions, wherein said dopant anion is nitrosonium hexafluorophosphate.

In certain embodiments, the present invention relates to any one of the aforementioned compositions, wherein said polymer coated is substantially dried.

In certain embodiments, the present invention relates to any one of the aforementioned compositions, wherein said polymer coating comprises polymerized optionally-substituted heteroaryls represented by formula I:

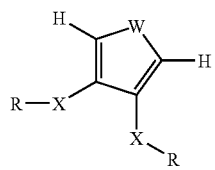

I wherein, independently for each occurrence,

W is —O—, —S— or —N($R^A$)—;

X is —O—, —S— or —N($R^A$)—;

R is -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^B$;

$R^A$ is -hydrogen, -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^B$;

$R^B$ is -hydrogen, -alkyl, -cycloalkyl, -heterocycloalkyl, -alkenyl, -cycloalkenyl, -heterocycloalkenyl, -alkynyl, -aryl or -heteroaryl; and p is 0-5 inclusive.

In certain embodiments, the present invention relates to any one of the aforementioned compositions, wherein W is —S—.

In certain embodiments, the present invention relates to any one of the aforementioned compositions, wherein X is —O—.

In certain embodiments, the present invention relates to any one of the aforementioned compositions, wherein R is -alkyl.

In certain embodiments, the present invention relates to any one of the aforementioned compositions, wherein W is —S—; X is —O—; and R is -alkyl.

In certain embodiments, the present invention relates to any one of the aforementioned compositions, wherein said polymer coating comprises polymerized optionally-substituted heteroaryls represented by formula II:

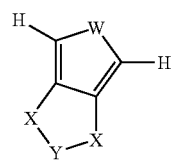

II wherein, independently for each occurrence,

W is —O—, —S— or —N($R^A$)—;

X is —O—, —S— or —N($R^A$)—;

Y is —C($R^B$)$_2$—, —C($R^B$)$_2$C($R^B$)$_2$— or —C($R^B$)$_2$C($R^B$)$_2$C($R^B$)$_2$—;

$R^A$ is -hydrogen, -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^C$;

$R^B$ is -hydrogen, -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^C$;

$R^C$ is -hydrogen, -alkyl, -cycloalkyl, -heterocycloalkyl, -alkenyl, -cycloalkenyl, -heterocycloalkenyl, -alkynyl, -aryl or -heteroaryl; and p is 0-5 inclusive.

In certain embodiments, the present invention relates to any one of the aforementioned compositions, wherein W is —S—.

In certain embodiments, the present invention relates to any one of the aforementioned compositions, wherein X is —O—.

In certain embodiments, the present invention relates to any one of the aforementioned compositions, wherein W is —S—; and Y is —C($R^B$)$_2$C($R^B$)$_2$—.

In certain embodiments, the present invention relates to any one of the aforementioned compositions, wherein W is —S—; X is —O—; and Y is —C($R^B$)$_2$C($R^B$)$_2$—.

In certain embodiments, the present invention relates to any one of the aforementioned compositions, wherein W is —S—; X is —O—; Y is —C($R^B$)$_2$C($R^B$)$_2$—; and $R^B$ is -hydrogen or -alkyl.

In certain embodiments, the present invention relates to any one of the aforementioned compositions, wherein W is —S—; X is —O—; Y is —C($R^B$)$_2$C($R^B$)$_2$—; and $R^B$ is -hydrogen.

In certain embodiments, the present invention relates to any one of the aforementioned compositions, wherein W is —S—; X is —O—; Y is —C($R^B$)$_2$C($R^B$)$_2$—; $R^B$ is -hydrogen; and said metal-containing oxidant is iron(III) chloride.

In certain embodiments, the present invention relates to any one of the aforementioned compositions, wherein W is —S—; X is —O—; Y is —C($R^B$)$_2$C($R^B$)$_2$—; $R^B$ is -hydrogen; said metal-containing oxidant is iron(III) chloride; and said gaseous base is present and is pyridine.

In certain embodiments, the present invention relates to any one of the aforementioned compositions, wherein said polymer coating comprises polymerized 3,4-ethylenedioxythiophene.

In certain embodiments, the present invention relates to any one of the aforementioned compositions, wherein said surface comprises benzene, naphthalene, anthracene, thiophene, thianthrene, furan, pyran, isobenzofuran, chromene, xanthene, phenoxanthene, pyrrole, imidazole, pyrazole, isothiazole, isoxazole, pyridine, pyrazine, pyrimidine, pyridazine, indolizine, isoindole, indole, indazole, purine, quinolizine, isoquinoline, quinoline, phthalazine, naphthyridine, quinoxaline, quinazoline, cinnoline, pteridine, carbazole, carboline, phenanthridine, acridine, pyrimidine, phenanthroline, phenazine, phenarsazine, phenothiazine, furazan, phenoxazine, pyrrolidine, oxolane, thiolane, oxazole, piperidine, piperazine, morpholine, lactones, azetidinones, pyrrolidinones, sultams, or sultones.

In certain embodiments, the present invention relates to any one of the aforementioned compositions, wherein said surface comprises benzene.

In certain embodiments, the present invention relates to any one of the aforementioned compositions, wherein said surface is a polymer comprising polymerized monomers represented by formula III or formula IV:

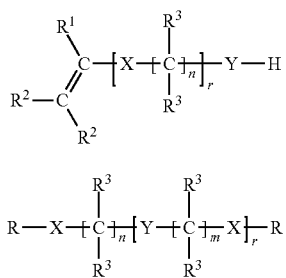

III

IV wherein, independently for each occurrence,

X is absent, —O—, —N(R)—, —S—, —C(=O)O—, —C(=O)N(R)—, —C(=O)S—, —S(=O)—, —S(=O)$_2$—, —C(R$^4$)$_2$—, —C(=O)—, —C(=NR)—, —C(=S)—, —C(R$^4$)=C(R$^4$)—, —C≡C—, -cycloalkyl-, -heterocycloalkyl-, -cycloalkenyl-, -heterocycloalkenyl-, -aryl-, or -heteroaryl-;

Y is -aryl-, or -heteroaryl-;

R is -hydrogen, -halogen, -alkyl, -cycloalkyl, -heterocycloalkyl, -alkenyl, -cycloalkenyl, -heterocycloalkenyl, -alkynyl, -cyano, -aryl, or -heteroaryl;

R$^1$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

R$^2$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

R$^3$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

R$^4$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

m is 0-4 inclusive;
n is 0-4 inclusive;
p is 0-10 inclusive; and
r is 1-5 inclusive.

In certain embodiments, the present invention relates to any one of the aforementioned compositions, wherein said surface is a polymer comprising polymerized monomers represented by formula III.

In certain embodiments, the present invention relates to any one of the aforementioned compositions, wherein said surface is a polymer comprising polymerized monomers represented by formula III; and X is absent.

In certain embodiments, the present invention relates to any one of the aforementioned compositions, wherein said surface is a polymer comprising polymerized monomers represented by formula III; and R$^1$ is hydrogen.

In certain embodiments, the present invention relates to any one of the aforementioned compositions, wherein said surface is a polymer comprising polymerized monomers represented by formula III; and R$^2$ is -hydrogen.

In certain embodiments, the present invention relates to any one of the aforementioned compositions, wherein said surface is a polymer comprising polymerized monomers represented by formula III; and R$^3$ is -hydrogen.

In certain embodiments, the present invention relates to any one of the aforementioned compositions, wherein said surface is a polymer comprising polymerized monomers represented by formula III; and n is 0.

In certain embodiments, the present invention relates to any one of the aforementioned compositions, wherein said surface is a polymer comprising polymerized monomers represented by formula III; and r is 0.

In certain embodiments, the present invention relates to any one of the aforementioned compositions, wherein said surface is a polymer comprising polymerized monomers represented by formula III; and Y is -aryl-.

In certain embodiments, the present invention relates to any one of the aforementioned compositions, wherein said surface is a polymer comprising polymerized monomers represented by formula III; and Y is —C$_6$H$_4$.

In certain embodiments, the present invention relates to any one of the aforementioned compositions, wherein said surface is a polymer comprising polymerized monomers represented by formula IV.

In certain embodiments, the present invention relates to any one of the aforementioned compositions, wherein said surface is a polymer comprising polymerized monomers represented by formula IV; and X is absent, —C(=O)O—, or —C(=O)N(R)—.

In certain embodiments, the present invention relates to any one of the aforementioned compositions, wherein said surface is a polymer comprising polymerized monomers represented by formula IV; and R is -hydrogen or -alkyl.

In certain embodiments, the present invention relates to any one of the aforementioned compositions, wherein said surface is a polymer comprising polymerized monomers represented by formula IV; and R$^4$ is -hydrogen.

In certain embodiments, the present invention relates to any one of the aforementioned compositions, wherein said surface is a polymer comprising polymerized monomers represented by formula IV; and Y is -aryl-.

In certain embodiments, the present invention relates to any one of the aforementioned compositions, wherein said surface is a polymer comprising polymerized monomers represented by formula IV; and Y is —C$_6$H$_4$—.

In certain embodiments, the present invention relates to any one of the aforementioned compositions, wherein said surface is a polymer comprising polymerized monomers represented by formula IV; and Y is —C$_{10}$H$_6$—.

In certain embodiments, the present invention relates to any one of the aforementioned compositions, wherein said surface is poly styrene, poly ethyleneterephthalate, poly carbonate, poly ethylenenaphthalate, poly urethane, poly (acrylonitrile-butadiene-styrene), or a copolymer thereof.

In certain embodiments, the present invention relates to any one of the aforementioned compositions, wherein said surface is poly styrene.

In certain embodiments, the present invention relates to any one of the aforementioned compositions, wherein said surface comprises alumina, gold, glass, silicon dioxide, quartz, alumino-silicates, tin oxide, iron oxide, chromium oxide, asbestos, talc, stainless steel, titanium dioxide, copper, nickel, zinc, lead, indium tin oxide, marble, chalk, gypsum, or barytes.

In certain embodiments, the present invention relates to any one of the aforementioned compositions, wherein said surface comprises silicon.

In certain embodiments, the present invention relates to any one of the aforementioned compositions, wherein said surface comprises gold.

In certain embodiments, the present invention relates to any one of the aforementioned compositions, further comprising the step of contacting a pre-surface with a linker which comprises an aryl or heteroaryl moiety, thereby forming said surface comprising aryl or heteroaryl moieties.

In certain embodiments, the present invention relates to any one of the aforementioned compositions, wherein said linker is represented by formula V:

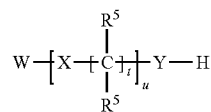

wherein, independently for each occurrence,

W is —SiZ$_3$ or —SR;

X is absent, —O—, —N(R)—, —S—, —C(=O)O—, —C(=O)N(R)—, —C(=O)S—, —S(=O)—, —S(=O)$_2$—, —C(R$^4$)$_2$—, —C(=O)—, —C(=NR)—, —C(=S)—, —C(R$^4$)=C(R$^4$)—, —C≡C—, -cycloalkyl-, -heterocycloalkyl-, -cycloalkenyl-, -heterocycloalkenyl-, -aryl-, or -heteroaryl-;

Y is -aryl-, or -heteroaryl-;

Z is R$^4$, —Cl, —Br, —I, —OR, —NR$_2$, —SR, —S(—O)R, or —S(=O)$_2$R;

R is -hydrogen, -halogen, -alkyl, -cycloalkyl, -heterocycloalkyl, -alkenyl, -cycloalkenyl, -heterocycloalkenyl, -alkynyl, -cyano, -aryl, or -heteroaryl;

R$^4$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

R$^5$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

p is 0-10 inclusive;

t is 0-20 inclusive; and u is 1-20 inclusive.

In certain embodiments, the present invention relates to any one of the aforementioned compositions, wherein X is absent.

In certain embodiments, the present invention relates to any one of the aforementioned compositions, wherein R$^5$ is -hydrogen.

In certain embodiments, the present invention relates to any one of the aforementioned compositions, wherein W is —SiZ$_3$.

In certain embodiments, the present invention relates to any one of the aforementioned compositions, wherein W is —SR.

In certain embodiments, the present invention relates to any one of the aforementioned compositions, wherein W is —SiZ$_3$; and Z is —Cl, —Br, or —I.

In certain embodiments, the present invention relates to any one of the aforementioned compositions, wherein W is —SiZ$_3$; and Z is —Cl.

In certain embodiments, the present invention relates to any one of the aforementioned compositions, wherein W is —SiZ$_3$; and Z is —OR.

In certain embodiments, the present invention relates to any one of the aforementioned compositions, wherein W is —SiZ$_3$; Z is —OR; and R is -alkyl.

In certain embodiments, the present invention relates to any one of the aforementioned compositions, wherein W is —SR.

In certain embodiments, the present invention relates to any one of the aforementioned compositions, herein W is —SR; and R is -hydrogen.

In certain embodiments, the present invention relates to any one of the aforementioned compositions, wherein t is 0-5.

In certain embodiments, the present invention relates to any one of the aforementioned compositions, wherein u is 1-5.

In certain embodiments, the present invention relates to any one of the aforementioned compositions, wherein Y is -aryl-.

In certain embodiments, the present invention relates to any one of the aforementioned compositions, wherein Y is —C$_6$H$_4$—.

In certain embodiments, the present invention relates to any one of the aforementioned compositions, wherein said linker is phenyltrichlorosilane.

In certain embodiments, the present invention relates to any one of the aforementioned compositions, further comprising a second polymer coating, wherein said second polymer coating comprises an aryl or heteroaryl moiety.

In certain embodiments, the present invention relates to any one of the aforementioned compositions, wherein said second polymer is poly styrene, poly ethyleneterephthalate, poly carbonate, poly ethylenenaphthalate, poly urethane, poly (acrylonitrile-butadiene-styrene), or a copolymer thereof.

In certain embodiments, the present invention relates to any one of the aforementioned compositions, wherein said second polymer is poly styrene.

Another aspect of the invention relates to the composition obtained by the process of any one of methods discussed below.

Methods of the Invention

One aspect of the invention relates to a method of forming a polymer coating on a surface comprising the steps of: contacting said surface with a gaseous metal-containing oxidant thereby forming an oxidant-enriched surface; optionally contacting said oxidant-enriched surface with a gaseous base; and contacting said oxidant-enriched surface with a gaseous monomer, thereby forming a polymer coated surface; wherein said surface comprises aryl or heteroaryl moieties; and said gaseous monomer is selected from the group consisting of aryls and heteroaryls.

One aspect of the invention relates to a method of forming a polymer coating on a surface comprising the steps of: contacting a surface with a gaseous metal-containing oxidant, thereby forming an oxidant-enriched surface; and contacting said oxidant-enriched surface with a gaseous monomer, thereby forming a polymer coated surface; wherein said surface comprises aryl or heteroaryl moieties; and said gaseous monomer is selected from the group consisting of optionally substituted thiophenes, furans, pyrroles, and anilines.

One aspect of the invention relates to a method of forming a polymer coating on a surface comprising the steps of: contacting a surface with a gaseous metal-containing oxidant, thereby forming an oxidant-enriched surface; and contacting said oxidant-enriched surface with a gaseous monomer, thereby forming a polymer coated surface; wherein said surface comprises aryl or heteroaryl moieties; and said gaseous monomer is selected from the group consisting of optionally substituted thiophenes.

In certain embodiments, the present invention relates to any one of the aforementioned methods, wherein said gaseous monomer is an optionally substituted thiophene.

In certain embodiments, the present invention relates to any one of the aforementioned methods, wherein said coating is of a substantially uniform thickness.

In certain embodiments, the present invention relates to any one of the aforementioned methods, wherein said thickness does not vary more than 10% over the surface.

In certain embodiments, the present invention relates to any one of the aforementioned methods, wherein said thickness does not vary more than 5% over the surface.

In certain embodiments, the present invention relates to any one of the aforementioned methods, wherein said thickness does not vary more than 1% over the surface.

In certain embodiments, the present invention relates to any one of the aforementioned methods, wherein said polymer coating has a mass per surface area of less than about 500 µg/cm$^2$.

In certain embodiments, the present invention relates to any one of the aforementioned methods, wherein said polymer coating has a mass per surface area of less than about 100 µg/cm$^2$.

In certain embodiments, the present invention relates to any one of the aforementioned methods, wherein said polymer coating has a mass per surface area of less than about 50 µg/cm$^2$.

In certain embodiments, the present invention relates to any one of the aforementioned methods, wherein said polymer coating has a mass per surface area of less than about 10 µg/cm$^2$.

In certain embodiments, the present invention relates to any one of the aforementioned methods, wherein said polymer coating has a mass per surface area of less than about 5 µg/cm$^2$.

In certain embodiments, the present invention relates to any one of the aforementioned methods, wherein said polymer coating is conductive.

In certain embodiments, the present invention relates to any one of the aforementioned methods, wherein said polymer coating has a conductivity of between about 100 S/cm and about 200 S/cm.

In certain embodiments, the present invention relates to any one of the aforementioned methods, wherein said polymer coating has a conductivity of between about 150 S/cm and about 200 S/cm.

In certain embodiments, the present invention relates to any one of the aforementioned methods, wherein said gaseous metal-containing oxidant is selected from the group consisting of iron(III) chloride, iron(III) toslyate, potassium iodate, potassium chromate, ammonium sulfate and tetrabutylammonium persulfate.

In certain embodiments, the present invention relates to any one of the aforementioned methods, wherein said gaseous metal-containing oxidant is iron(III) chloride.

In certain embodiments, the present invention relates to any one of the aforementioned methods, wherein said gaseous metal-containing oxidant has an oxidation potential between about 0.5 V and about 1.0 V.

In certain embodiments, the present invention relates to any one of the aforementioned methods, wherein said gaseous metal-containing oxidant has an oxidation potential of about 0.75 V.

In certain embodiments, the present invention relates to any one of the aforementioned methods, further comprising contacting said oxidant-enriched surface with a gaseous base.

In certain embodiments, the present invention relates to any one of the aforementioned methods, wherein said gaseous base is an optionally substituted pyridine.

In certain embodiments, the present invention relates to any one of the aforementioned methods, further comprising the step of washing said conducting polymer coated surface with a solvent.

In certain embodiments, the present invention relates to any one of the aforementioned methods, wherein said solvent is selected from the group consisting of water, methanol, ethanol, isopropanol, acetonitrile and mixtures thereof.

In certain embodiments, the present invention relates to any one of the aforementioned methods, wherein said solvent is methanol.

In certain embodiments, the present invention relates to any one of the aforementioned methods, further comprising the step of contacting said polymer-coated surface with a dopant anion.

In certain embodiments, the present invention relates to any one of the aforementioned methods, wherein said dopant anion is selected from the group consisting of chloride, bromide, iodide, fluoride, phosphate and sulfonate.

In certain embodiments, the present invention relates to any one of the aforementioned methods, wherein said dopant anion is nitrosonium hexafluorophosphate.

In certain embodiments, the present invention relates to any one of the aforementioned methods, further comprising the step of warming said polymer-coated surface under vacuum.

In certain embodiments, the present invention relates to any one of the aforementioned methods, wherein said gaseous monomer is an optionally-substituted heteroaromatic represented by formula I:

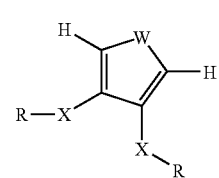

wherein, independently for each occurrence,

W is —O—, —S— or —N(R$^A$)—;

X is —O—, —S— or —N(R$^A$)—;

R is -alkyl, -cycloalkyl, -heterocycloalkyl, -alkenyl, -cycloalkenyl, -heterocycloalkenyl, -alkynyl, -aryl, -heteroaryl or —[C(R$^B$)$_2$]$_p$—R$^B$;

R$^A$ is -hydrogen, -alkyl, -cycloalkyl, -heterocycloalkyl, -alkenyl, -cycloalkenyl, -heterocycloalkenyl, -alkynyl, -aryl, -heteroaryl or [C(R$^B$)$_2$]$_p$—R$^B$;

R$^B$ is -hydrogen, -alkyl, -cycloalkyl, -heterocycloalkyl, -alkenyl, -cycloalkenyl, -heterocycloalkenyl, -alkynyl, -aryl or -heteroaryl; and p is 0-5 inclusive.

In certain embodiments, the present invention relates to any one of the aforementioned methods, wherein W is —S—.

In certain embodiments, the present invention relates to any one of the aforementioned methods, wherein X is —O—.

In certain embodiments, the present invention relates to any one of the aforementioned methods, wherein R is -alkyl.

In certain embodiments, the present invention relates to any one of the aforementioned methods, wherein W is —S—; X is —O—; and R is -alkyl.

In certain embodiments, the present invention relates to any one of the aforementioned methods, wherein said gaseous monomer is an optionally substituted heteroaromatic represented by formula II:

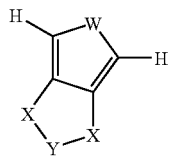

wherein, independently for each occurrence,

W is —O—, —S— or —N($R^A$)—;

X is —O—, —S— or —N($R^A$)—;

Y is —C($R^B$)$_2$—, —C($R^B$)$_2$C($R^B$)$_2$— or —C($R^B$)$_2$C($R^B$)$_2$C($R^B$)$_2$—;

$R^A$ is -hydrogen, -alkyl, -cycloalkyl, -heterocycloalkyl, -alkenyl, -cycloalkenyl, -heterocycloalkenyl, -alkynyl, -aryl, -heteroaryl or [C($R^B$)$_2$]$_p$—$R^C$;

$R^B$ is -hydrogen, -alkyl, -cycloalkyl, -heterocycloalkyl, -alkenyl, -cycloalkenyl, -heterocycloalkenyl, -alkynyl, -aryl, -heteroaryl or —[C($R^B$)$_2$]$_p$—$R^C$;

$R^C$ is -hydrogen, -alkyl, -cycloalkyl, -heterocycloalkyl, -alkenyl, -cycloalkenyl, -heterocycloalkenyl, -alkynyl, -aryl or -heteroaryl; and p is 0-5 inclusive.

In certain embodiments, the present invention relates to any one of the aforementioned methods, wherein W is —S—.

In certain embodiments, the present invention relates to any one of the aforementioned methods, wherein X is —O—.

In certain embodiments, the present invention relates to any one of the aforementioned methods, wherein W is —S—; and Y is —C($R^B$)$_2$C($R^B$)$_2$—.

In certain embodiments, the present invention relates to any one of the aforementioned methods, wherein W is —S—; X is —O—; and Y is —C($R^B$)$_2$C($R^B$)$_2$—.

In certain embodiments, the present invention relates to any one of the aforementioned methods, wherein W is —S—; X is —O—; Y is —C($R^B$)$_2$C($R^B$)$_2$—; and $R^B$ is -hydrogen or -alkyl.

In certain embodiments, the present invention relates to any one of the aforementioned methods, wherein W is —S—; X is —O—; Y is —C($R^B$)$_2$C($R^B$)$_2$—; and $R^B$ is -hydrogen.

In certain embodiments, the present invention relates to any one of the aforementioned methods, wherein W is —S—; X is —O—; Y is —C($R^B$)$_2$C($R^B$)$_2$—; $R^B$ is -hydrogen; and said metal-containing oxidant is iron(III) chloride.

In certain embodiments, the present invention relates to any one of the aforementioned methods, further comprising contacting said oxidant-enriched surface with a gaseous base, wherein W is —S—; X is —O—; Y is —C($R^B$)$_2$C($R^B$)$_2$—; $R^B$ is -hydrogen; said metal-containing oxidant is iron(III) chloride; and said gaseous base is pyridine.

In certain embodiments, the present invention relates to any one of the aforementioned methods, wherein said gaseous monomer is 3,4-ethylenedioxythiophene.

In certain embodiments, the present invention relates to any one of the aforementioned methods, wherein said surface comprises benzene, naphthalene, anthracene, thiophene, thianthrene, furan, pyran, isobenzofuran, chromene, xanthene, phenoxanthene, pyrrole, imidazole, pyrazole, isothiazole, isoxazole, pyridine, pyrazine, pyrimidine, pyridazine, indolizine, isoindole, indole, indazole, purine, quinolizine, isoquinoline, quinoline, phthalazine, naphthyridine, quinoxaline, quinazoline, cinnoline, pteridine, carbazole, carboline, phenanthridine, acridine, pyrimidine, phenanthroline, phenazine, phenarsazine, phenothiazine, furazan, phenoxazine, pyrrolidine, oxolane, thiolane, oxazole, piperidine, piperazine, morpholine, lactones, azetidinones, pyrrolidinones, sultams, or sultones.

Figure 13:
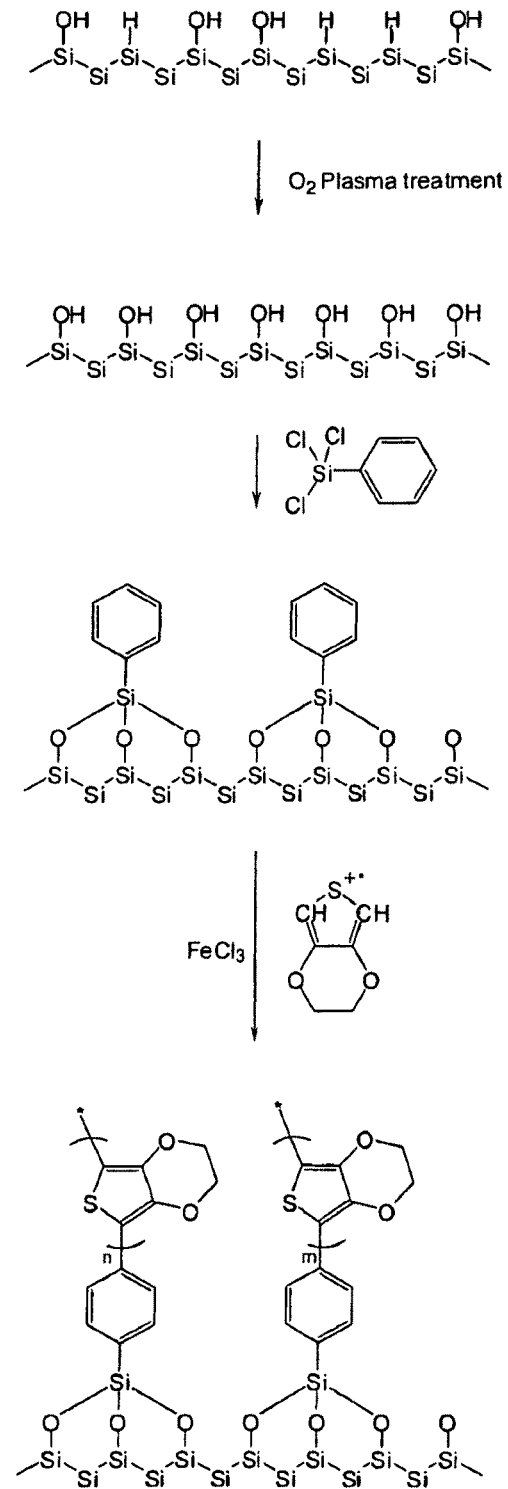
FIG. 13 depicts an approach to using a silane coupling agent to introduce an aryl moiety (e.g., a benzene) onto a surface.

An example of a surface comprising benzene is a polystyrene surface, or a surface as shown in FIG. 13.

In certain embodiments, the present invention relates to any one of the aforementioned methods, wherein said surface comprises benzene, naphthalene, or anthracene.

In certain embodiments, the present invention relates to any one of the aforementioned methods, wherein said surface comprises benzene.

In certain embodiments, the present invention relates to any one of the aforementioned methods, wherein said surface is a polymer comprising polymerized monomers represented by formula III or formula IV:

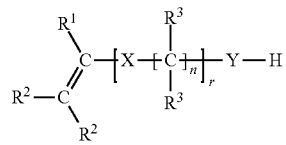

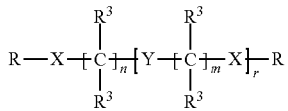

wherein, independently for each occurrence,

X is absent, —O—, —N(R)—, —S—, —C(=O)O—, —C(=O)N(R)—, —C(=O)S—, —S(=O)—, —S(=O)$_2$—, —C($R^4$)$_2$—, —C(=O)—, —C(=NR)—, —C(=S)—, —C($R^4$)=C($R^4$)—, —C≡C—, -cycloalkyl-, -heterocycloalkyl-, -cycloalkenyl-, -heterocycloalkenyl-, -aryl-, or -heteroaryl-;

Y is -aryl-, or -heteroaryl-;

R is -hydrogen, -halogen, -alkyl, -cycloalkyl, -heterocycloalkyl, -alkenyl, -cycloalkenyl, -heterocycloalkenyl, -alkynyl, -cyano, -aryl, or -heteroaryl;

$R^1$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

$R^2$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

$R^3$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

$R^4$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

m is 0-4 inclusive;

n is 0-4 inclusive;

p is 0-10 inclusive; and r is 1-5 inclusive.

In certain embodiments, the present invention relates to any one of the aforementioned methods, wherein said surface is a polymer comprising polymerized monomers represented by formula III.

In certain embodiments, the present invention relates to any one of the aforementioned methods, wherein said surface is a polymer comprising polymerized monomers represented by formula III; and X is absent.

In certain embodiments, the present invention relates to any one of the aforementioned methods, wherein said surface is a polymer comprising polymerized monomers represented by formula III; and $R^1$ is hydrogen.

In certain embodiments, the present invention relates to any one of the aforementioned methods, wherein said surface is a polymer comprising polymerized monomers represented by formula III; and $R^2$ is -hydrogen.

In certain embodiments, the present invention relates to any one of the aforementioned methods, wherein said surface is a polymer comprising polymerized monomers represented by formula III; and $R^3$ is -hydrogen.

In certain embodiments, the present invention relates to any one of the aforementioned methods, wherein said surface is a polymer comprising polymerized monomers represented by formula III; and n is 0.

In certain embodiments, the present invention relates to any one of the aforementioned methods, wherein said surface is a polymer comprising polymerized monomers represented by formula III; and r is 0.

In certain embodiments, the present invention relates to any one of the aforementioned methods, wherein said surface is a polymer comprising polymerized monomers represented by formula III; and Y is -aryl-.

In certain embodiments, the present invention relates to any one of the aforementioned methods, wherein said surface is a polymer comprising polymerized monomers represented by formula III; and Y is —$C_6H_4$—.

In certain embodiments, the present invention relates to any one of the aforementioned methods, wherein said surface is a polymer comprising polymerized monomers represented by formula IV.

In certain embodiments, the present invention relates to any one of the aforementioned methods, wherein said surface is a polymer comprising polymerized monomers represented by formula IV; and X is absent, —C(═O)O—, or —C(═O)N(R)—.

In certain embodiments, the present invention relates to any one of the aforementioned methods, wherein said surface is a polymer comprising polymerized monomers represented by formula IV; and R is -hydrogen or -alkyl.

In certain embodiments, the present invention relates to any one of the aforementioned methods, wherein said surface is a polymer comprising polymerized monomers represented by formula IV; and $R^4$ is -hydrogen.

In certain embodiments, the present invention relates to any one of the aforementioned methods, wherein said surface is a polymer comprising polymerized monomers represented by formula IV; and Y is -aryl-.

In certain embodiments, the present invention relates to any one of the aforementioned methods, wherein said surface is a polymer comprising polymerized monomers represented by formula IV; and Y is —$C_6H_4$—.

In certain embodiments, the present invention relates to any one of the aforementioned methods, wherein said surface is a polymer comprising polymerized monomers represented by formula IV; and Y is —$C_{10}H_6$—.

In certain embodiments, the present invention relates to any one of the aforementioned methods, wherein said surface is poly styrene, poly ethyleneterephthalate, poly carbonate, poly ethylenenaphthalate, poly urethane, poly (acrylonitrile-butadiene-styrene), or a copolymer thereof.

In certain embodiments, the present invention relates to any one of the aforementioned methods, wherein said surface is poly styrene.

In certain embodiments, the present invention relates to any one of the aforementioned methods, wherein said surface further comprises alumina, gold, glass, silicon dioxide, quartz, alumino-silicates, tin oxide, iron oxide, chromium oxide, asbestos, talc, stainless steel, titanium dioxide, copper, nickel, zinc, lead, indium tin oxide, marble, chalk, gypsum, or barytes.

In certain embodiments, the present invention relates to any one of the aforementioned methods, wherein said surface further comprises silicon.

In certain embodiments, the present invention relates to any one of the aforementioned methods, wherein said surface further comprises gold.

In certain embodiments, the present invention relates to any one of the aforementioned methods, further comprising the step of contacting a pre-surface with a linker which comprises an aryl or heteroaryl moiety, thereby forming said surface comprising aryl or heteroaryl moieties.

In certain embodiments, the present invention relates to any one of the aforementioned methods, wherein said linker is represented by formula V:

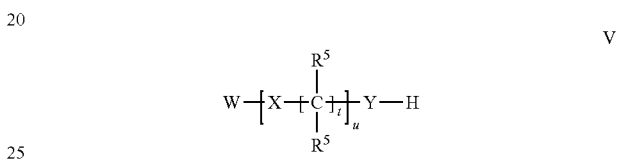

wherein, independently for each occurrence,

W is —$SiZ_3$ or —SR;

X is absent, —O—, —N(R)—, —S—, —C(═O)O—, —C(═O)N(R)—, —C(═O)S—, —S(═O)—, —S(═O)$_2$—, —C($R^4$)$_2$—, —C(═O)—, —C(═NR)—, —C(═S)—, —C($R^4$)═C($R^4$)—, —C≡C—, -cycloalkyl-, -heterocycloalkyl-, -cycloalkenyl-, -heterocycloalkenyl-, -aryl-, or -heteroaryl-;

Y is -aryl-, or -heteroaryl-;

Z is $R^4$, —Cl, —Br, —I, —OR, —$NR_2$, —SR, —S(═O)R, or —S(═O)$_2$R;

R is -hydrogen, -halogen, -alkyl, -cycloalkyl, -heterocycloalkyl, -alkenyl, -cycloalkenyl, -heterocycloalkenyl, -alkynyl, -cyano, -aryl, or -heteroaryl;

$R^4$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

$R^5$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

p is 0-10 inclusive;

t is 0-20 inclusive; and u is 1-20 inclusive.

In certain embodiments, the present invention relates to any one of the aforementioned methods, wherein X is absent.

In certain embodiments, the present invention relates to any one of the aforementioned methods, wherein $R^5$ is -hydrogen.

In certain embodiments, the present invention relates to any one of the aforementioned methods, wherein W is —$SiZ_3$.

In certain embodiments, the present invention relates to any one of the aforementioned methods, wherein W is —SR.

In certain embodiments, the present invention relates to any one of the aforementioned methods, wherein W is —$SiZ_3$; and Z is —Cl, —Br, or —I.

In certain embodiments, the present invention relates to any one of the aforementioned methods, wherein W is —$SiZ_3$; and Z is —Cl.

In certain embodiments, the present invention relates to any one of the aforementioned methods, wherein W is —SiZ$_3$; and Z is —OR.

In certain embodiments, the present invention relates to any one of the aforementioned methods, wherein W is —SiZ$_3$; Z is —OR; and R is -alkyl.

In certain embodiments, the present invention relates to any one of the aforementioned methods, wherein W is —SR.

In certain embodiments, the present invention relates to any one of the aforementioned methods, wherein W is —SR; and R is -hydrogen.

In certain embodiments, the present invention relates to any one of the aforementioned methods, wherein t is 0-5.

In certain embodiments, the present invention relates to any one of the aforementioned methods, wherein u is 1-5.

In certain embodiments, the present invention relates to any one of the aforementioned methods, wherein Y is -aryl-.

In certain embodiments, the present invention relates to any one of the aforementioned methods, wherein Y is —C$_6$H$_4$—.

In certain embodiments, the present invention relates to any one of the aforementioned methods, wherein said linker is phenyltrichlorosilane.

In certain embodiments, the present invention relates to any one of the aforementioned methods, further comprising the step of coating a pre-surface with a second polymer coating, wherein said second polymer coating comprises an aryl or heteroaryl moiety, thereby forming said surface comprising aryl or heteroaryl moieties.

In certain embodiments, the present invention relates to any one of the aforementioned methods, wherein said step of coating a pre-surface with a second polymer coating is achieved by spin coating said pre-surface.

In certain embodiments, the present invention relates to any one of the aforementioned methods, wherein said second polymer is poly styrene, poly ethyleneterephthalate, poly carbonate, poly ethylenenaphthalate, poly urethane, poly (acrylonitrile-butadiene-styrene), or a copolymer thereof.

In certain embodiments, the present invention relates to any one of the aforementioned methods, wherein said second polymer is poly styrene.

In certain embodiments, the present invention relates to any one of the aforementioned methods, further comprising the step of selectively removing a portion of said polymer coating, thereby forming a pattern on said surface.

In certain embodiments, the present invention relates to any one of the aforementioned methods, wherein a mask is used to achieve said selective removal.

Applications and Articles of the Invention Using PEDOT

Due to its high electrical conductivity and good optical transparency, poly (3,4-ethylenedioxythiophene) (PEDOT) has drawn a great deal of industrial and academic attention. (Groenendaal, B. L., Jonas, F., Freitag, D., Pielartzik, H. & Reynolds, J. R. *Advanced Materials* 2000, 12, 481-494; Groenendaal, L., Zotti, G., Aubert, P. H., Waybright, S. M. & Reynolds; J. R. *Advanced Materials* 2003, 15, 855-879; and Kirchmeyer, S. & Reuter, K. *J Mater Chem* 2005, 15, 2077-2088.) These unique properties have lead to interesting device applications, such as organic light emitting diodes (OLEDs), organic thin film transistors (OTFTs), organic photovoltaic cells (OPVs), and sensors. (Chen, C. T. *Chemistry of Materials* 2004, 16, 4389-4400; Kulkarni, A. P., Tonzola, C. J., Babel, A. & Jenekhe, S. A. *Chemistry of Materials* 2004, 16, 4556-4573; Kawase, T., Sirringhaus, H., Friend, R. H. & Shimoda, T. *Advanced Materials* 2001, 13, 1601-1605; Coakley, K. M. & McGehee, M. D. *Chemistry of Materials* 2004, 16, 4533-4542; and Sotzing, G. A., Briglin, S. M., Grubbs, R. H. & Lewis, N. S. *Analytical Chemistry* 2000, 72, 3181-3190.)

PEDOT has proven to be an extremely useful material for organic semiconductor devices. As described herein, the ability to deposit PEDOT from the vapor phase will expand its utility in devices that already contain it and enable the development of new organic electronics including ones that are fabricated on unconventional substrates like paper and fabric. In addition, electrochromic responses of PEDOT can be applied in dynamically tinting window glass or as an organic memory device.

The CVD technique disclosed herein for PEDOT eliminates wet processing steps that can destroy some electronic devices and organic semiconductor layers through wetting or the spin-coating process often used to apply solution-based films. CVD PEDOT does not have inherent acidity known to corrode adjacent layers in devices causing early failure. The CVD coating process is compatible on a variety of organic and inorganic materials since it does not depend on evenly wetting the substrate surface. CVD provided a uniform coating on rough, fibrous, and porous morphologies with high surface areas. Increasing the effective surface area of devices will improve operating efficiencies. In addition, the ability to conformably coat rough and sharp electrode features will reduce the change of a short through the conducting polymer layer resulting in longer device lifetimes.

Importantly, the formation of PEDOT films on the types of substrates which lead to enhanced adhesion between the PEDOT and the surface which is coated may lead to novel and improved organic light emitting diodes (OLEDs), photovoltaics, simple transistors, electrochromic films, and super capacitors. In addition, the methods disclosed herein may be used in energy-saving devices, such as plastic solar cells and electrochromic films for tinting architectural glass. Vapor-phase deposition of conducting organic materials for building inexpensive transistors on substrates could also be applied to polymeric radio-frequency identification (RFID) tags.

One aspect of the invention relates to an article comprising a surface which is coated with a conductive polymer coating, wherein said surface comprising aryl or heteroaryl moieties; and said coating comprises polymerized optionally substituted thiophenes, furans, pyrroles, or anilines.

Another aspect of the invention relates to an article comprising a surface which is coated with a conductive polymer coating, wherein said surface comprising aryl or heteroaryl moieties; and said coating comprises polymerized optionally substituted thiophenes.

In certain embodiments, the present invention relates to any one of the aforementioned articles, wherein said article is integrated circuitry in flexible electronics.

In certain embodiments, the present invention relates to any one of the aforementioned articles, wherein said article is, or is incorporated into, an organic memory device, a light-emitting diode, an electrochromic device, a display device, a photovoltaic device, a capacitor or a circuit board.

In certain embodiments, the present invention relates to any one of the aforementioned articles, wherein said polymer coating comprises optionally substituted thiophenes.

In certain embodiments, the present invention relates to any one of the aforementioned articles, wherein said coating is of a substantially uniform thickness.

In certain embodiments, the present invention relates to any one of the aforementioned articles, wherein said thickness does not vary more than 10% over the surface.

In certain embodiments, the present invention relates to any one of the aforementioned articles, wherein said thickness does not vary more than 5% over the surface.

In certain embodiments, the present invention relates to any one of the aforementioned articles, wherein said thickness does not vary more than 1% over the surface.

In certain embodiments, the present invention relates to any one of the aforementioned articles, wherein said polymer coating has a mass per surface area of less than about 500 μg/cm$^2$.

In certain embodiments, the present invention relates to any one of the aforementioned articles, wherein said polymer coating has a mass per surface area of less than about 100 μg/cm$^2$.

In certain embodiments, the present invention relates to any one of the aforementioned articles, wherein said polymer coating has a mass per surface area of less than about 50 μg/cm$^2$.

In certain embodiments, the present invention relates to any one of the aforementioned articles, wherein said polymer coating has a mass per surface area of less than about 10 μg/cm$^2$.

In certain embodiments, the present invention relates to any one of the aforementioned articles, wherein said polymer coating has a mass per surface area of less than about 5 μg/cm$^2$.

In certain embodiments, the present invention relates to any one of the aforementioned articles, wherein said polymer coating is conductive.

In certain embodiments, the present invention relates to any one of the aforementioned articles, wherein said polymer coating has a conductivity of between about 100 S/cm and about 200 S/cm.

In certain embodiments, the present invention relates to any one of the aforementioned articles, wherein said polymer coating has a conductivity of between about 150 S/cm and about 200 S/cm.

In certain embodiments, the present invention relates to any one of the aforementioned articles, wherein said surface further comprises a gaseous metal-containing oxidant selected from the group consisting of iron(III) chloride, iron(III) toslyate, potassium iodate, potassium chromate, ammonium sulfate and tetrabutylammonium persulfate.

In certain embodiments, the present invention relates to any one of the aforementioned articles, wherein said gaseous metal-containing oxidant is iron(III) chloride.

In certain embodiments, the present invention relates to any one of the aforementioned articles, wherein said gaseous metal-containing oxidant has an oxidation potential between about 0.5 V and about 1.0 V.

In certain embodiments, the present invention relates to any one of the aforementioned articles, wherein said gaseous metal-containing oxidant has an oxidation potential of about 0.75 V.

In certain embodiments, the present invention relates to any one of the aforementioned articles, further comprising a dopant anion.

In certain embodiments, the present invention relates to any one of the aforementioned articles, wherein said dopant anion is selected from the group consisting of chloride, bromide, iodide, fluoride, phosphate and sulfonate.

In certain embodiments, the present invention relates to any one of the aforementioned articles, wherein said dopant anion is nitrosonium hexafluorophosphate.

In certain embodiments, the present invention relates to any one of the aforementioned articles, wherein said polymer coated is substantially dried.

In certain embodiments, the present invention relates to any one of the aforementioned articles, wherein said polymer coating comprises polymerized optionally-substituted heteroaryls represented by formula I:

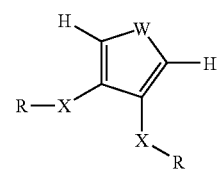

I wherein, independently for each occurrence,
W is —O—, —S— or —N(R$^A$)—;
X is —O—, —S— or —N(R$^A$)—;
R is -alkyl, -cycloalkyl, -heterocycloalkyl, -alkenyl, -cycloalkenyl, -heterocycloalkenyl, -alkynyl, -aryl, -heteroaryl or —[C(R$^B$)$_2$]$_p$—R$^B$;
R$^A$ is -hydrogen, -alkyl, -cycloalkyl, -heterocycloalkyl, -alkenyl, -cycloalkenyl, -heterocycloalkenyl, -alkynyl, -aryl, -heteroaryl or —[C(R$^B$)$_2$]$_p$—R$^8$;
R$^B$ is -hydrogen, -alkyl, -cycloalkyl, -heterocycloalkyl, -alkenyl, -cycloalkenyl, -heterocycloalkenyl, -alkynyl, -aryl or -heteroaryl; and
p is 0-5 inclusive.

In certain embodiments, the present invention relates to any one of the aforementioned articles, wherein W is —S—.

In certain embodiments, the present invention relates to any one of the aforementioned articles, wherein X is —O—.

In certain embodiments, the present invention relates to any one of the aforementioned articles, wherein R is -alkyl.

In certain embodiments, the present invention relates to any one of the aforementioned articles, wherein W is —S—; X is —O—; and R is -alkyl.

In certain embodiments, the present invention relates to any one of the aforementioned articles, wherein said polymer coating comprises polymerized optionally-substituted heteroaryls represented by formula II:

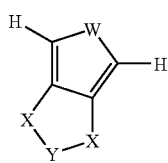

II wherein, independently for each occurrence,
W is —O—, —S— or —N(R$^A$)—;
X is —O—, —S— or —N(R$^A$)—;
Y is —C(R$^B$)$_2$—, —C(R$^B$)$_2$C(R$^B$)$_2$— or —C(R$^B$)$_2$C(R$^B$)$_2$C(R$^B$)$_2$—;
R$^A$ is -hydrogen, -alkyl, -cycloalkyl, -heterocycloalkyl, -alkenyl, -cycloalkenyl, -heterocycloalkenyl, -alkynyl, -aryl, -heteroaryl or —[C(R$^B$)$_2$]$_p$—R$^C$;
R$^B$ is -hydrogen, -alkyl, -cycloalkyl, -heterocycloalkyl, -alkenyl, -cycloalkenyl, -heterocycloalkenyl, -alkynyl, -aryl, -heteroaryl or —[C(R$^B$)$_2$]$_p$—R$^C$;
R$^C$ is -hydrogen, -alkyl, -cycloalkyl, -heterocycloalkyl, -alkenyl, -cycloalkenyl, -heterocycloalkenyl, -alkynyl, -aryl or -heteroaryl; and
p is 0-5 inclusive.

In certain embodiments, the present invention relates to any one of the aforementioned articles, wherein W is —S—.

In certain embodiments, the present invention relates to any one of the aforementioned articles, wherein X is —O—.

In certain embodiments, the present invention relates to any one of the aforementioned articles, wherein W is —S—; and Y is —C($R^B$)$_2$C($R^B$)$_2$—.

In certain embodiments, the present invention relates to any one of the aforementioned articles, wherein W is —S—; X is —O—; and Y is —C($R^B$)$_2$C($R^B$)$_2$—.

In certain embodiments, the present invention relates to any one of the aforementioned articles, wherein W is —S—; X is —O—; Y is —C($R^B$)$_2$C($R^B$)$_2$—; and $R^B$ is -hydrogen or -alkyl.

In certain embodiments, the present invention relates to any one of the aforementioned articles, wherein W is —S—; X is —O—; Y is —C($R^B$)$_2$C($R^B$)$_2$—; and $R^B$ is -hydrogen.

In certain embodiments, the present invention relates to any one of the aforementioned articles, wherein W is —S—; X is —O—; Y is —C($R^B$)$_2$C($R^B$)$_2$—; $R^B$ is -hydrogen; and said metal-containing oxidant is iron(III) chloride.

In certain embodiments, the present invention relates to any one of the aforementioned articles, wherein W is —S—; X is —O—; Y is —C($R^B$)$_2$C($R^B$)$_2$—; $R^B$ is -hydrogen; said metal-containing oxidant is iron(III) chloride; and said gaseous base is present and is pyridine.

In certain embodiments, the present invention relates to any one of the aforementioned articles, wherein said polymer coating comprises polymerized 3,4-ethylenedioxythiophene.

In certain embodiments, the present invention relates to any one of the aforementioned articles, wherein said surface comprises benzene, naphthalene, anthracene, thiophene, thianthrene, furan, pyran, isobenzofuran, chromene, xanthene, phenoxanthene, pyrrole, imidazole, pyrazole, isothiazole, isoxazole, pyridine, pyrazine, pyrimidine, pyridazine, indolizine, isoindole, indole, indazole, purine, quinolizine, isoquinoline, quinoline, phthalazine, naphthyridine, quinoxaline, quinazoline, cinnoline, pteridine, carbazole, carboline, phenanthridine, acridine, pyrimidine, phenanthroline, phenazine, phenarsazine, phenothiazine, furazan, phenoxazine, pyrrolidine, oxolane, thiolane, oxazole, piperidine, piperazine, morpholine, lactones, azetidinones, pyrrolidinones, sultams, or sultones.

In certain embodiments, the present invention relates to any one of the aforementioned articles, wherein said surface comprises benzene, naphthalene, or anthracene.

In certain embodiments, the present invention relates to any one of the aforementioned articles, wherein said surface comprises benzene.

In certain embodiments, the present invention relates to any one of the aforementioned articles, wherein said surface is a polymer comprising polymerized monomers represented by formula III or formula IV:

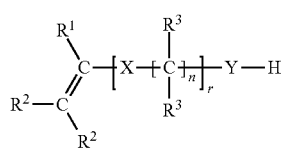

III

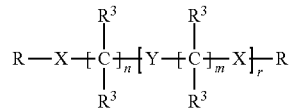

IV wherein, independently for each occurrence,

X is absent, —O—, —N(R)—, —S—, —C(=O)O—, —C(=O)N(R)—, —C(=O)S—, —S(=O)—, —S(=O)$_2$—, —C($R^4$)$_2$—, —C(=O)—, —C(=NR)—, —C(=S)—, —C($R^4$)=C($R^4$)—, —C≡C—, -cycloalkyl-, -heterocycloalkyl-, -cycloalkenyl-, -heterocycloalkenyl-, -aryl-, or -heteroaryl-;

Y is -aryl-, or -heteroaryl-;

R is -hydrogen, -halogen, -alkyl, -cycloalkyl, -heterocycloalkyl, -alkenyl, -cycloalkenyl, -heterocycloalkenyl, -alkynyl, -cyano, -aryl, or -heteroaryl;

$R^1$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

$R^2$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

$R^3$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

$R^4$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

m is 0-4 inclusive;
n is 0-4 inclusive;
p is 0-10 inclusive; and
r is 1-5 inclusive.

In certain embodiments, the present invention relates to any one of the aforementioned articles, wherein said surface is a polymer comprising polymerized monomers represented by formula III.

In certain embodiments, the present invention relates to any one of the aforementioned articles, wherein said surface is a polymer comprising polymerized monomers represented by formula III; and X is absent.

In certain embodiments, the present invention relates to any one of the aforementioned articles, wherein said surface is a polymer comprising polymerized monomers represented by formula III; and $R^1$ is hydrogen.

In certain embodiments, the present invention relates to any one of the aforementioned articles, wherein said surface is a polymer comprising polymerized monomers represented by formula III; and $R^2$ is -hydrogen.

In certain embodiments, the present invention relates to any one of the aforementioned articles, wherein said surface is a polymer comprising polymerized monomers represented by formula III; and $R^3$ is -hydrogen.

In certain embodiments, the present invention relates to any one of the aforementioned articles, wherein said surface is a polymer comprising polymerized monomers represented by formula III; and n is 0.

In certain embodiments, the present invention relates to any one of the aforementioned articles, wherein said surface is a polymer comprising polymerized monomers represented by formula III; and r is 0.

In certain embodiments, the present invention relates to any one of the aforementioned articles, wherein said surface is a polymer comprising polymerized monomers represented by formula III; and Y is -aryl-.

In certain embodiments, the present invention relates to any one of the aforementioned articles, wherein said surface is a polymer comprising polymerized monomers represented by formula III; and Y is —$C_6H_4$—.

In certain embodiments, the present invention relates to any one of the aforementioned articles, wherein said surface is a polymer comprising polymerized monomers represented by formula IV.

In certain embodiments, the present invention relates to any one of the aforementioned articles, wherein said surface is a polymer comprising polymerized monomers represented by formula IV; and X is absent, —C(=O)O—, or —C(=O)N(R)—.

In certain embodiments, the present invention relates to any one of the aforementioned articles, wherein said surface is a polymer comprising polymerized monomers represented by formula IV; and R is -hydrogen or -alkyl.

In certain embodiments, the present invention relates to any one of the aforementioned articles, wherein said surface is a polymer comprising polymerized monomers represented by formula IV; and $R^4$ is -hydrogen.

In certain embodiments, the present invention relates to any one of the aforementioned articles, wherein said surface is a polymer comprising polymerized monomers represented by formula IV; and Y is -aryl-.

In certain embodiments, the present invention relates to any one of the aforementioned articles, wherein said surface is a polymer comprising polymerized monomers represented by formula IV; and Y is —$C_6H_4$—.

In certain embodiments, the present invention relates to any one of the aforementioned articles, wherein said surface is a polymer comprising polymerized monomers represented by formula IV; and Y is —$C_{10}H_6$—.

In certain embodiments, the present invention relates to any one of the aforementioned articles, wherein said surface is poly styrene, poly ethyleneterephthalate, poly carbonate, poly ethylenenaphthalate, poly urethane, poly (acrylonitrile-butadiene-styrene), or a copolymer thereof.

In certain embodiments, the present invention relates to any one of the aforementioned articles, wherein said surface is poly styrene.

In certain embodiments, the present invention relates to any one of the aforementioned articles, wherein said surface comprises alumina, gold, glass, silicon dioxide, quartz, alumino-silicates, tin oxide, iron oxide, chromium oxide, asbestos, talc, stainless steel, titanium dioxide, copper, nickel, zinc, lead, indium tin oxide, marble, chalk, gypsum, or barytes.

In certain embodiments, the present invention relates to any one of the aforementioned articles, wherein said surface comprises silicon.

In certain embodiments, the present invention relates to any one of the aforementioned articles, wherein said surface comprises gold.

In certain embodiments, the present invention relates to any one of the aforementioned articles, further comprising the step of contacting a pre-surface with a linker which comprises an aryl or heteroaryl moiety, thereby forming said surface comprising aryl or heteroaryl moieties.

In certain embodiments, the present invention relates to any one of the aforementioned articles, wherein said linker is represented by formula V:

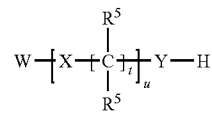

V wherein, independently for each occurrence,

W is —$SiZ_3$ or —SR;

X is absent, —O—, —N(R)—, —S—, —C(=O)O—, —C(=O)N(R)—, —C(=O)S—, —S(=O)—, —S(=O)$_2$—, —C($R^4$)$_2$—, —C(=O)—, —C(=NR)—, —C(=S)—, —C($R^4$)=C($R^4$)—, —C≡C—, -cycloalkyl-, -heterocycloalkyl-, -cycloalkenyl-, -heterocycloalkenyl-, -aryl-, or -heteroaryl-;

Y is -aryl-, or -heteroaryl-;

Z is $R^4$, —Cl, —Br, —I, —OR, —$NR_2$, —SR, —S(=O)R, or —S(=O)$_2$R;

R is -hydrogen, -halogen, -alkyl, -cycloalkyl, -heterocycloalkyl, -alkenyl, -cycloalkenyl, -heterocycloalkenyl, -alkynyl, -cyano, -aryl, or -heteroaryl;

$R^4$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

$R^5$ is -hydrogen, -halogen, -alkyl, -cycloalkyl, -heterocycloalkyl, -alkenyl, -cycloalkenyl, -heterocycloalkenyl, -alkynyl, -aryl, -heteroaryl or —[C(R)$_2$]$_p$—XR;

p is 0-10 inclusive;

t is 0-20 inclusive; and u is 1-20 inclusive.

In certain embodiments, the present invention relates to any one of the aforementioned articles, wherein X is absent.

In certain embodiments, the present invention relates to any one of the aforementioned articles, wherein $R^5$ is -hydrogen.

In certain embodiments, the present invention relates to any one of the aforementioned articles, wherein W is —$SiZ_3$.

In certain embodiments, the present invention relates to any one of the aforementioned articles, wherein W is —SR.

In certain embodiments, the present invention relates to any one of the aforementioned articles, wherein W is —$SiZ_3$; and Z is —Cl, —Br, or —I.

In certain embodiments, the present invention relates to any one of the aforementioned articles, wherein W is —$SiZ_3$; and Z is —Cl.

In certain embodiments, the present invention relates to any one of the aforementioned articles, wherein W is —$SiZ_3$; and Z is —OR.

In certain embodiments, the present invention relates to any one of the aforementioned articles, wherein W is —$SiZ_3$; Z is —OR; and R is -alkyl.

In certain embodiments, the present invention relates to any one of the aforementioned articles, wherein W is —SR.

In certain embodiments, the present invention relates to any one of the aforementioned articles, herein W is —SR; and R is -hydrogen.

In certain embodiments, the present invention relates to any one of the aforementioned articles, wherein t is 0-5.

In certain embodiments, the present invention relates to any one of the aforementioned articles, wherein u is 1-5.

In certain embodiments, the present invention relates to any one of the aforementioned articles, wherein Y is -aryl-.

In certain embodiments, the present invention relates to any one of the aforementioned articles, wherein Y is —$C_6H_4$—.

In certain embodiments, the present invention relates to any one of the aforementioned articles, wherein said linker is phenyltrichlorosilane.

In certain embodiments, the present invention relates to any one of the aforementioned articles, further comprising a second polymer coating, wherein said second polymer coating comprises an aryl or heteroaryl moiety.

In certain embodiments, the present invention relates to any one of the aforementioned articles, wherein said second polymer is poly styrene, poly ethyleneterephthalate, poly carbonate, poly ethylenenaphthalate, poly urethane, poly (acrylonitrile-butadiene-styrene), or a copolymer thereof.

In certain embodiments, the present invention relates to any one of the aforementioned articles, wherein said second polymer is poly styrene.

EXEMPLIFICATION

The invention now being generally described, it will be more readily understood by reference to the following examples, which are included merely for purposes of illustration of certain aspects and embodiments of the present invention, and are not intended to limit the invention.

In general, as described herein, film thicknesses were measured on a Tencor P-10 profilometer. Conductivity measurements were done with a four point probe (Model MWP-6, Jandel Engineering, Ltd). Tape test was performed according to the standard test method (ASTM D3359-97). FTIR spectra were obtained via Nexus 870, Thermo Electron Corporation. Ultrasonication of PEDOT film was performed in pure water for 15 to 180 minutes by a 100 W ultrasonicator (Cole-Parmer, Model 8891R). The surface morphology and surface damage, such as delamination, buckling, and cracking of PEDOT film was examined by optical microscopy (Olympus, Model CX41) with the maximum magnification of ×1000. Wrinkled surfaces of PEDOT/poly styrene film were monitored with AFM (Digital Instruments, Dimension 3100). Images of the PEDOT patterns were obtained with Enviromental Scanning Electron Microscopy, (FEI/Philips XL30 FEG ESEM).

Example 1

Deposition of PEDOT

The detailed deposition procedure of oxidative chemical vapor deposition (oCVD) was published elsewhere. (J. P. Lock, S. G. Im, K. K. Gleason, *Macromolecules* 2006, 39, 5326; and U.S. Patent Application Publication No. 2006/0269664-A1, hereby incorporated by reference in its entirety.) $FeCl_3$ is used as the oxidizing agent for polymerizing the monomer EDOT to obtain PEDOT. The process pressure was 150 mTorr, the substrate temperature was 70~90° C. and EDOT flow rate was 4±1 sccm. After 30 minutes of oCVD process, 30~100 nm thick transparent PEDOT films were obtained on polymeric and Si wafer substrates. After the deposition, the film was rinsed with either copious water or methanol. Maintaining the same process conditions except for replacing the EDOT flow with a 15 sccm of pyrrole or 20 sccm of aniline, resulted in oCVD polypyrole and polyaniline, respectively. All the reagents were purchased from Aldrich and used without any further purification. For ungrafted PEDOT-poly styrene layer in FIG. 2c, additional 150 nm-thick poly styrene layer was spun-cast onto oCVD PEDOT (60 nm) film on Si wafer.

Example 2

Attaching the Silane Coupling Agent for Inorganic Substrates

Substrates were cleaned by a 60 s exposure to oxygen plasma (100 $W/cm^2$, 100 mTorr). Then the substrates were placed in a vacuum chamber at a gauge pressure of −15 mmHg and exposed to PTCS (Aldrich. 98%) vapor for 5 to 10 minutes at room temperature.

Example 3

Buckling

Poly styrene (number average molecular weight, $MW_n$=250,000 from ACROS) was spun-cast onto Si wafers to form 200-300 nm thick films. Then, PEDOT was deposited by oCVD to form PEDOT/poly styrene bilayers. The PEDOT/poly styrene bilayers were are attached to the lid of Petri dish and exposed to THF vapor for 5-60 s in room temperature. In analogous fashion PEDOT/PEO bilayers were formed by growing oCVD PEDOT on top of spun cast PEO ($MW_n$=200,000 and from ACROS) and then exposed to water vapor for 15-60 min in room temperature.

Example 4

Photolithography

The detailed procedures are described elsewhere. (R. W. Ryan, R. F. Kopf, R. A. Hamm, R. J. Malik, R. Masaitis, R. Opila, *Journal of Vacuum Science & Technology B* 1998, 16, 2759; and 1. Kymissis, C. D. Dimitrakopoulos, S. Purushothaman, *Journal of Vacuum Science & Technology B* 2002, 20, 956.) Firstly, the photoresist (PR) OCG 825 was spin coated onto a Si wafer to form 1 µm thick film, soft-baked at 90° C., exposed to 365-405 nm UV light through a photomask and developed using OCG 934. Grafted oCVD PEDOT was grown on top of the PR-patterned Si wafer, and then the PR pattern was lifted off via ultrasonication for 5 minutes in acetone.

Example 5

Capillary Force Lithography (K. Y. Suh, H. H. Lee, *Advanced Functional Materials* 2002, 12, 405): Poly styrene ($MW_n$=40,000 from PolySciences) was spin-coated to form 140 nm thick film on top of oCVD PEDOT films grafted to PET substrates. Pre-patterned polyurethane mold was applied on the poly styrene film spun on PEDOT and pressed at the temperature of 100~110° C. for 30~60 minutes to force poly styrene siphoned into the capillary of patterned mold, formed the pattern. Oxygen plasma etching was utilized to transfer the positive tone pattern to the directly grafted PEDOT layer.

Example 6

E-Beam Lithography

PMMA ($MW_n$=950,000 from MicroChem 3.5 wt % in chlorobenzene) was spin-coated to form 200 nm thick film on top of. Negative tone patterning PMMA was obtained at a dose of 800 µC/$cm^2$ and developed for 60 s with 1:3 solution of isopropanol—methylisobutylketone. Oxygen plasma etching was applied utilized to transfer the pattern to the directly grafted PEDOT layer.

INCORPORATION BY REFERENCE

All of the U.S. patents and U.S. patent application publications cited herein are hereby incorporated by reference.

EQUIVALENTS

Those skilled in the art will recognize, or be able to ascertain using no more than routine experimentation, many equivalents to the specific embodiments of the invention described herein. Such equivalents are intended to be encompassed by the following claims.

We claim:

1. A method comprising the steps of:
   contacting a surface of a substrate with a gaseous metal-containing oxidant, thereby forming an oxidant-enriched surface; and
   contacting said oxidant-enriched surface with a gaseous monomer, thereby forming a polymer-coated surface;
   wherein said surface of said substrate comprises aryl or heteroaryl moieties selected from the group consisting of: naphthalene, anthracene, thiophene, thianthrene, furan, pyran, isobenzofuran, chromene, xanthene, phenoxanthene, pyrrole, imidazole, pyrazole, isothiazole, isoxazole, pyridine, pyrazine, pyrimidine, pyridazine, indolizine, isoindole, indole, indazole, purine, quinolizine, isoquinoline, quinoline, phthalazine, naphthyridine, quinoxaline, quinazoline, cinnoline, pteridine, carbazole, carboline, phenanthridine, acridine, phenanthroline, phenarsazine, phenothiazine, furazan, phenoxazine, oxazole, and polyethylene naphthalate; and said gaseous monomer is selected from the group consisting of optionally substituted thiophenes, furans, pyrroles, and anilines.

2. The method of claim 1, wherein said gaseous metal-containing oxidant is selected from the group consisting of iron(III) chloride, iron(III) tosylate, potassium iodate, potassium chromate, ammonium sulfate and tetrabutylammonium persulfate.

3. The method of claim 1, further comprising contacting said oxidant-enriched surface with a gaseous base.

4. The method of claim 3, wherein said gaseous base is an optionally substituted pyridine.

5. The method of claim 1, further comprising the step of contacting said polymer-coated surface with a dopant anion.

6. The method of claim 1, further comprising the step of warming said polymer-coated surface under vacuum.

7. The method of claim 1, wherein said aryl or heteroaryl moieties are selected from the group consisting of: naphthalene and anthracene.

8. The method of claim 1, wherein said surface of said substrate is polyethylene naphthalate.

9. The method of claim 1, further comprising the step of selectively removing a portion of said polymer coating, thereby forming a pattern on said surface of said substrate.

10. The method of claim 1, wherein said gaseous metal-containing oxidant is iron(III) chloride.

11. The method of claim 5, wherein said dopant anion is nitrosonium hexafluorophosphate.

12. The method of claim 1, wherein said surface of said substrate further comprises alumina, gold, glass, silicon dioxide, quartz, alumino-silicates, tin oxide, iron oxide, chromium oxide, asbestos, talc, stainless steel, titanium dioxide, copper, nickel, zinc, lead, indium tin oxide, marble, chalk, gypsum, or barytes.

13. The method of claim 1, wherein said surface of said substrate further comprises silicon.

14. The method of claim 1, wherein said surface of said substrate further comprises gold.

* * * * *